United States Patent [19]

Southard

[11] Patent Number: 4,598,257

[45] Date of Patent: Jul. 1, 1986

[54] CLOCK PULSE SIGNAL GENERATOR SYSTEM

[75] Inventor: Gary D. Southard, Coral Springs, Fla.

[73] Assignee: Siemens Corporate Research & Support, Inc., Iselin, N.J.

[21] Appl. No.: 499,740

[22] Filed: May 31, 1983

[51] Int. Cl.[4] .......................... H03L 7/06; H03L 7/14
[52] U.S. Cl. ........................................ 331/2; 331/14; 331/18; 331/25; 331/49; 331/55
[58] Field of Search ...................... 331/1 A, 2, 14, 17, 331/18, 25, 34, 49, 55

[56] References Cited

U.S. PATENT DOCUMENTS

| | | | |
|---|---|---|---|
| 3,769,607 | 10/1973 | Thelen | 331/55 X |
| 4,164,629 | 8/1979 | Ollivier et al. | 331/55 X |
| 4,276,512 | 6/1981 | Wittke | 331/1 A X |
| 4,305,045 | 12/1981 | Metz et al. | 331/2 X |
| 4,380,742 | 4/1983 | Hart | 331/1 A |

Primary Examiner—Eugene R. LaRoche
Assistant Examiner—D. C. Mis
Attorney, Agent, or Firm—Thomas H. Jackson

[57] ABSTRACT

A clock pulse generator system for providing a highly stable clock signal consists of two separate redundant clock signal generators which are controlled to operate in dead synchronization with each other. A microprocessor controlled digital phase lock loop operates to control each of the two clock signal generators and selects among a plurality of operating states such that the average dynamic phase difference in the two clock pulse signals generated is practically zero. Furthermore, the instantaneous dynamic phase difference does not exceed the phase noise of the voltage controlled crystal oscillators of the phase lock loops and, in one embodiment, is normally less than ten pico seconds, each phase lock loop comprising means for performing a fine, as well as coarse, phase comparison among internally or externally generated reference signals, only one of which is the highly stable clock signal output.

45 Claims, 21 Drawing Figures

Microfiche Appendix Included
(1 Microfiche, 20 Pages)

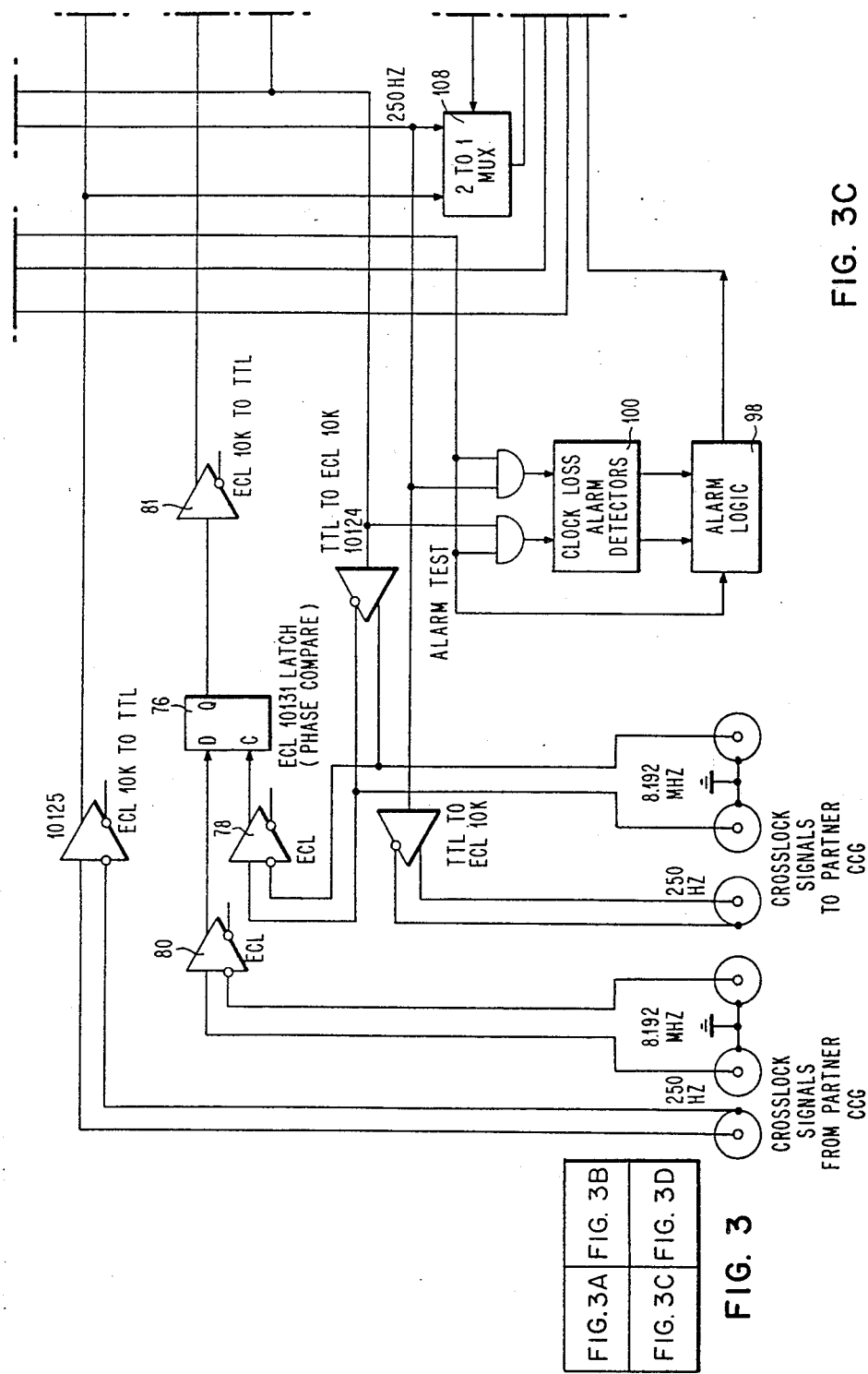

CLOCK PULSE SIGNAL GENERATOR SYSTEM

This application contains a Microfiche Appendix consisting of one fiche with twenty frames.

BACKGROUND OF THE INVENTION

The present invention relates to a system for generating a clock pulse signal. More particularly, the invention relates to a clock generator system of high reliability which operates to produce a clock pulse signal of high stability (substantially constant frequency).

Digital pulse code modulated (PCM) communication networks consist of a number of remote digital exchanges or "switches" interconnected by digital transmission facilities. Signals transmitted from one switch to another carry digital information at a pulse rate determined by the frequency of the local clock in the originating switch. This digital information is written into the terminating switch's storage register at this same, transmitted frequency. However, this information is read out of the storage register at a rate determined by the terminating switch's local clock. If the clocks of the originating switch and terminating switch operate at different rates, so that information is transmitted and read into a storage register at one rate and read out of this storage register at another rate, it will be seen that this storage register must eventually overflow or exhaust. This impairment, called a "slip", results in either the repetition or deletion of an entire 125 microsecond PCM frame.

It is therefore desirable to operate all clocks of a switched digital network at the same rate. In particular, it is desirable to align the average frequency of the clock pulse signals of all the local, spacially separated clocks of the network. This process of aligning clocks is called "synchronization", a word derived from the Greek words "syn", meaning "together", and "chronos", meaning "time".

Throughout the history of mankind, people have contemplated the nature of space and time and have attempted to create clocks which operate synchronously at remote locations. Countless ingenious methods and devices have been devised through the ages to synchronize remote clocks.

The problems are varied and complex, and these problems have led to solutions which are also varied and complex. Basically, the goal is to establish one extremely stable reference clock at one location and a less stable, yet highly accurate clock at each of the other locations which is capable of synchronizing itself to the reference clock. The reference clock may be an "atomic clock"—for example a rubidium or cesium frequency standard—whereas the remote, slave clocks may operate with a temperature—stabilized, voltage controlled crystal oscillator.

With a synchronized clock system of this type, wherein a plurality of slave clocks are ultimately synchronized to one master reference clock (often via other slave clocks), the following problems must be considered and overcome:

(1) The signal transmitted from the master clock to a slave clock is subject to wander (frequency variation) and jitter (phase variation). Furthermore, the signal may lose its integrity or disappear completely, for example as a result of a natural phenomenon such as a thunderstorm or a manmade break in the signal transmission channel. Thus, the slave clock must be equipped to discern the average frequency of the master clock signal and to detect certain failure conditions of this signal, such as undue wander and jitter or absolute loss of signal, and to take quick remedial action upon detection of failure.

(2) The slave clock must be capable of being maintained on a routine basis, or repaired if a failure occurs, while maintaining a stable, synchronized signal output. These requirements call for a slave clock with at least two, redundant units so that one unit can be removed and maintained or repaired while the other unit continues to operate. However, with two clock units operating simultaneously, there remains the problem of synchronizing these units with each other as well as with the master reference clock. Ideally, it should be possible to switch from one of the two redundant units to the other while maintaining a constant frequency (slip free) and constant phase (glitch free) output signal.

It is therefore known to provide a system comprising a highly stable (and expensive) master clock and a plurality of less stable (and less expensive) slave clocks operating substantially in synchronism with the master clock. It is also known to provide slave clocks in such a system with two or more redundant units. However, it has not, as yet, been possible to provide means at the remote, slave location, for promptly perceiving and detecting certain types of failure of the master clock signal nor has it been possible to switch from one redundant unit at the slave clock site to the other without a discontinuity in frequency and/or phase in the output clock signal produced by this slave clock.

Generally, the detectable failures in the external reference clock signal—that is, the signal from the master clock—are limited to situations where the signal is completely lost or where its frequency changes from its original proper frequency by an amount $\Delta f$ for a certain period of time $\Delta t$. In particular, the slave clock is able to measure when $\Delta f \times \Delta t$ exceeds a prescribed threshold value. As is apparent, failures which commence with a very small change in frequency take considerable time to detect so that the frequencies of the slave clocks, which are locked to the external reference clock signal, will follow the shift in frequency of this reference signal until, ultimately, the slave clock frequency bears no close relationship to the orignal frequency of the master clock.

The second difficulty occurs when one of the two redundant clock units, which is operating "on-line" to produce an output clock signal in response to the incoming reference signal from the master clock, fails and recourse must be had to a second, redundant clock unit. In this case, the second clock unit must immediately be brought on-line so that the system will not lose its synchronism as a result of the failure of the first clock unit. As mentioned above, however, the difficulty arises in that the output of the second clock unit is not normally exactly in phase with that of the first clock unit so that a switch-over from the first to the second redundant clock unit results in a phase discontinuity.

SUMMARY OF THE INVENTION

It is an object of the present invention to provide apparatus for generating a clock pulse signal which is highly reliable and can be repaired, if necessary, without taking it out of operation.

It is a further object of the present invention to provide a clock pulse generator of the above-noted type which is capable of producing a clock pulse signal of high stability (that is, of substantially constant frequency) without discontinuities in phase.

It is a further object of the present invention to provide a clock pulse generator which is capable of monitoring an external reference clock signal and producing an output clock pulse signal substantially in synchronism with the average frequency of the reference clock signal.

It is a further object of the present invention to provide a clock pulse generator which is capable of monitoring an external clock reference signal and determining if and when this reference signal fails without degradation in the stability of its own output signal.

These objects, as well as other objects which will become appatent from the discussion that follows are achieved, according to the present invention, by providing a clock pulse generator consisting of two separate, redundant clocks which operate in "dead synchronism" with each other; that is, these clocks produce output clock pulse signals which have no difference in frequency at all and have only an infinitesimal difference in phase. In practice, the average phase difference of the two clock pulse signals is zero, whereas the instantaneous phase difference may be a maximum of only 12.5 picoseconds (ps).

More particularly, the apparatus according to the present invention includes a first and a second clock generator, each comprising an output terminal and a controllable oscillator for generating and presenting a clock pulse signal at this output terminal. Each clock generator also comprises a device for controlling the oscillator so as to maintain the frequency of the clock pulse signal substantially constant (in the case where the subject clock generator is operating as a "master") or to cause the frequency and phase of this clock pulse signal to closely follow the frequency and phase of the clock pulse signal produced by the other clock generator (in the case where the subject clock generator is operating as a "slave").

Thus, the apparatus according to the invention operates with two substantially identical clock generators, both of which are capable of either following an external reference clock signal (e.g., from a highly stable cesium or rubidium clock standard) and, in the alternative, of closely following the output clock signal the other one of the two clock generators.

In the terminology used herein, the clock generators are each designated as a "central clock generator" or "CCG" since, in operation in a digital system, these clocks are the central clock source for the system. Since the two CCG's are substantially identical, and they operate in synchronism, they are denominated "partners", each CCG being the partner of the other. Finally, one of the two partner CCG's normally operates as a "master" and the other as a "slave". The master CCG is operative either to produce a stable clock signal of its own or to follow the external reference clock signal. The slave CCG operates to produce an output clock signal which is identical in frequency and substantially identical in phase to the frequency and phase, respectively, of the output clock pulse signal produced by the master CCG.

The apparatus according to the invention provides certain capabilities which are extremely useful in a clock network of the type described in the "Background of the Invention" section above. First, the two clocks, operating in master and slave relationship, provide a stable platform from which to monitor and evaluate the performance of the external reference clock signal. Second, should the master CCG become faulty, it is possible to reverse the master slave relationship (master CCG becomes the slave and the slave CCG becomes the master) without the slightest phase slip or discontinuity in the output signal.

Finally, it is possible for each of the two partner clocks to monitor each other and to take appropriate action when and if failure is suspected or detected in the other clock.

Reliability and stability may be further improved if two separate redundant, external reference clock signals are provided on separate, redundant channels to the clock system comprising the two partner CCG's. Providing redundant reference clock signals aids in the detection of failures of the system, as explained below.

With dual, redundant external reference clock signals and dual, redundant CCG's it is possible to identify and isolate failures with a high degree of probability. Each CCG continuously monitors and measures the phase drift, relative to its own phase, of the two external reference clock signals as well as its partner CCG. Since the two CCG's employ identical measurement equipment, they should both obtain the same measurements.

Specifically, if the two partner CCG's are designated CCG 0 and CCG 1 and the two external reference clock signals are designated REF A and REF B, we will have one of the following situations:

1. If the CCG 0 and the CCG 1 both determine that REF A and REF B are good (the normal situation) the system is considered to be working properly.

2. If the CCG 0 determines that REF A is bad but REF B is good, and the CCG 1 determines that both REF A and REF B are good, we conclude, on the basis of probability, that the CCG 0 has failed because the chances are infinitestimally small that the CCG 1 would conclude that REF A is good when it is, in fact, bad.

3. Similarly, if the CCG 0 determines that both REF A and REF B are bad, but the CCG 1 indicates that REF A and REF B are good, we conclude that the CCG 0 has failed.

4. If both the CCG 0 and the CCG 1 determine that REF A is bad and REF B is good, it is assumed that this determination is correct since the probability that the two clocks failed in exactly the same way at exactly the same time is infinitestimally small. Furthermore, there is a reasonably good chance that an external reference has indeed failed because such failure would normally occur far more frequently (due to a transmission channel problem) than one of the two CCG's. In this case, the master CCG (either CCG 1 or CCG 0) is locked onto REF B.

5. If the CCG 0 determines that REF A is good and REF B is bad, while the CCG 1 determines that the REF B is good and REF A is bad, we have an equal probability situation. In this case, the master CCG is decoupled from REF A and REF B and is allowed to "coast" until the problem is isolated or it is determinied that at least one of REF A and REF B are good.

6. If the CCG 0 and the CCG 1 both determine that REF A and REF B are both bad, it is assumed that this determination is correct and the master CCG is decoupled from both REF A and REF B and allowed to coast.

When the master CCG is in the coast mode (decoupled from REF A and REF B) the frequency of the master CCG is "frozen" at the frequency at which it was operating when it was decoupled from the external reference clock signal.

In practice, this frequency is frozen by holding constant the digital number applied as an input to the controllable oscillator and correcting this number, from time to time, to compensate for aging of the equipment.

In general, therefore, the apparatus according to the present invention includes two substantially identical clock generators which are maintained in synchronism in both frequency and phase. These clock generators receive at least one, and preferably two external reference clock signals and independently monitor and measure the phase drift in these reference clock signals. By making independent judgements about these external reference clock signals, it is possible to differentiate between an internal failure within the clock generators and an external failure; namely, failure of an external reference clock signal.

For a full understanding of the present invention, reference should now be made to the following detailed description of the preferred embodiment of the invention and to the accompanying drawings.

BRIEF DESCRIPTION OF THE DRAWINGS

FIG. 3 is a key figure showing the interrelationship among FIGS. 3A, 3B, 3C, and 3D; FIGS. 3A, 3B, 3C, and 3D comprising a block schematic diagram of the hardware employed in each RCI module and CCG of the FIG. 1.

DESCRIPTION OF THE PREFERRED EMBODIMENT

Figure 1:
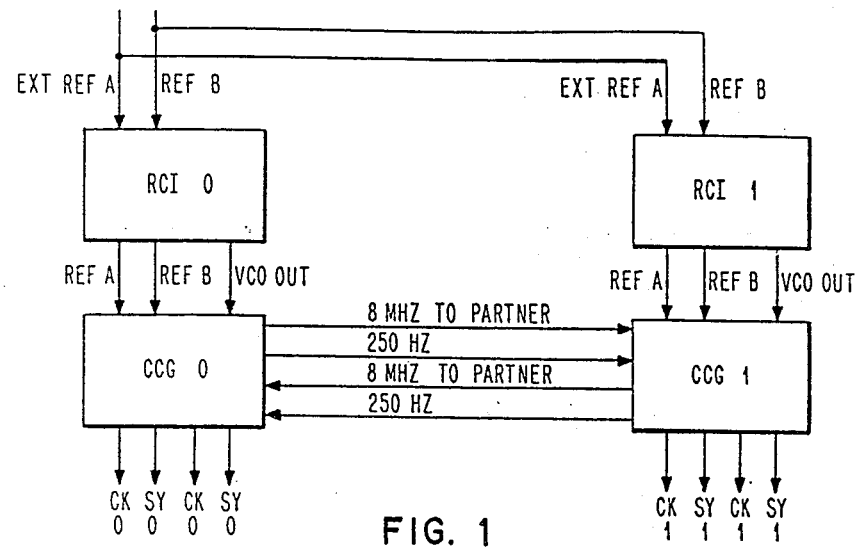
FIG. 1 is a block diagram showing the preferred embodiment of the clock system according to the present invention comprising two RCI modules and two CCG's.

A preferred embodiment of the present invention will now be described with reference to FIGS. 1-18 of the drawings. FIG. 1 shows the general structure of the clock system including two central clock generator modules CCG 0 and CCG 1 each connected to receive signals from a reference clock interface module RCI 0 and RCI 1, respectively, which receive external reference clock signals REF A and REF B. The central clock generators CCG 0 and CCG 1 each produce clock and synchronization signals (CK0, SY0 and CK1, SY1, respectively). The clock signals are an 8.192 MHz square wave and the synchronization (or "sync") signals are a 250 Hz square wave or "superframe" which is an exact subharmonic of the 8.192 MHz clock. The leading edges of the sync signals coincide with the leading edges of each 32,768th clock pulse. The outputs of each CCG are duplicated for added reliability through redundancy.

The central clock generators CCG 0 and CCG 1 are designed to operate in two primary modes: (1) the "CCG mode" wherein the CCG is the primary source of system timing, and (2) the "RCI mode" wherein the primary source of system timing is/are the external reference clock signal(s). The CCGs are also designed to operate in two secondary modes: (1) a "duplex mode" wherein each CCG is cross-locked in both phase and frequency to its partner CCG, and (2) a "simplex mode" wherein each CCG operates independently (not cross-locked to its partner). The simplex mode of operation is used when one of the CCGs fails in operation or when one of the CCG modules is replaced during normal maintenance.

When operating in the duplex mode, one of the two CCGs is made the "master" CCG and the other CCG becomes the "slave". The slave CCG provides the standby source of system timing. For this reason, the clock and sync signals produced by the slave CCG are separately and independently distributed to all subordinate clock sub-systems and clock repeaters that are driven by the clock system described herein. Fault tolerance requirements dictate that the clock and sync signals of both CCGs be at the same frequency and phase ange (within specified tolerances).

Figure 2:
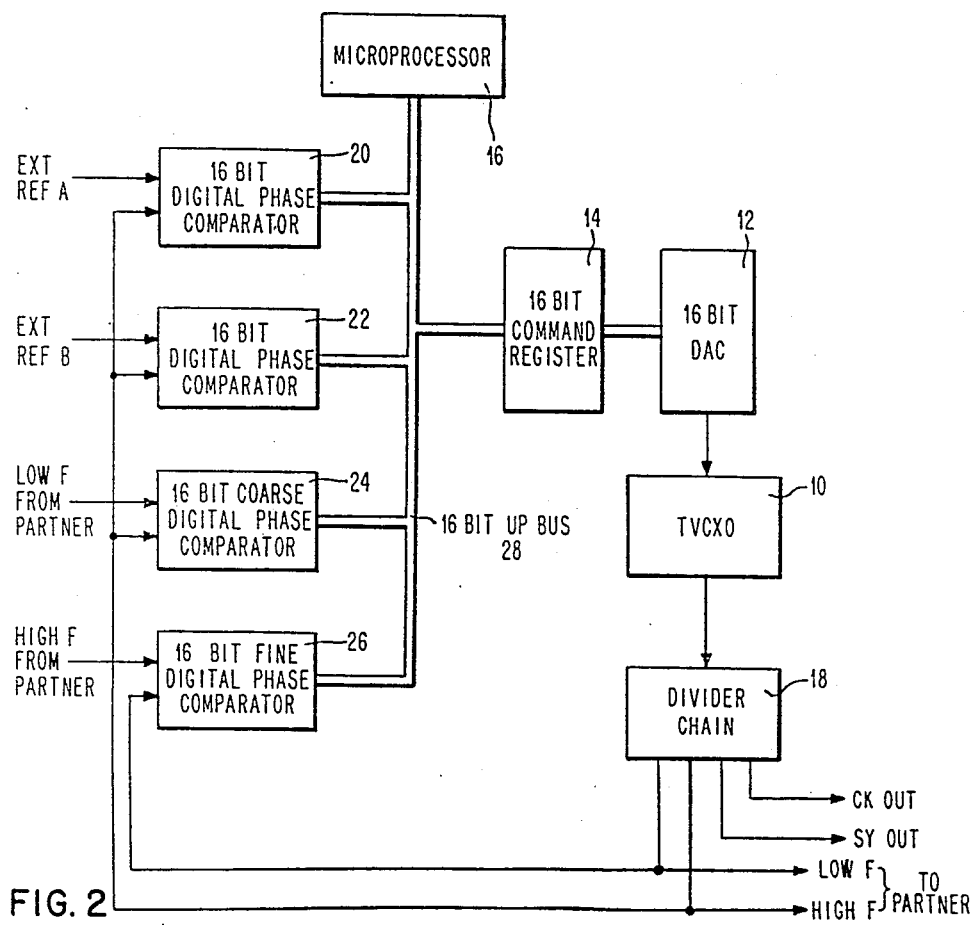
FIG. 2 is a block diagram showing the basic control loop employed in each CCG of FIG. 1.

Due to the very exacting requirements of the clock signals, each CCG contains an "intelligent" phase lock loop (PLL). The basic structure of the PLL is shown in FIG. 2. Whereas a conventional PLL is implemented with an analog phase detector and analog integrator/filter functioning together with a voltage controlled crystal oscillator (VCXO), the CCG is implemented with digital phase comparators, a microprocessor which performs differential and integral phase and frequency calculations and which controls a digital-to-analog converter (DAC) and thereby a VCXO. More particularly, the intelligent PLL shown in FIG. 2 comprises a temperature-compensated voltage controlled crystal oscillator (TVCX0) 10 which is controlled with a reference voltage supplied by a 16 bit DAC 12. The DAC receives its digital input from a 16 bit command register 14 which is loaded by a microprocessor 16. The processor provides the error measurement by coarsely comparing the phase of the appropriate reference (the two external inputs from the associated RCI, REF A and REF B to the output of the CCG divider chain 18 In performing a fine phase comparison, the microprocessor operates according to a filtering and fine locking algorithm which will be described in detail below.

The digital phase comparison operation is represented in FIG. 2 by four blocks 20, 22, 24 and 26 connected onto the 16 bit microprocessor bus 28. In implementation, this comparison function is somewhat more complicated and will also be described in detail below with the detailed description of FIGS. 3A, 3B, 3C and 3D.

Figure 3A:
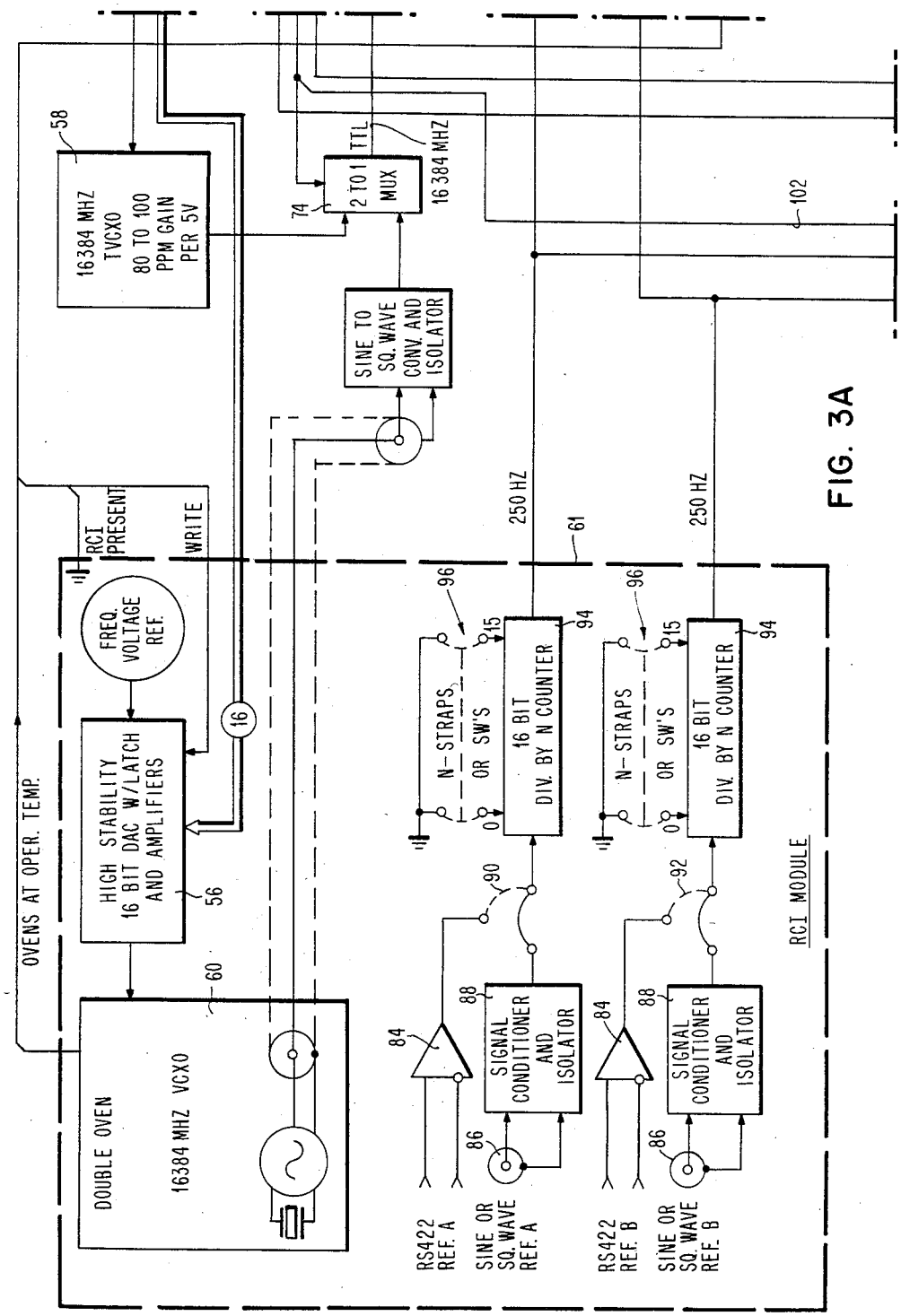
Figure 3B:
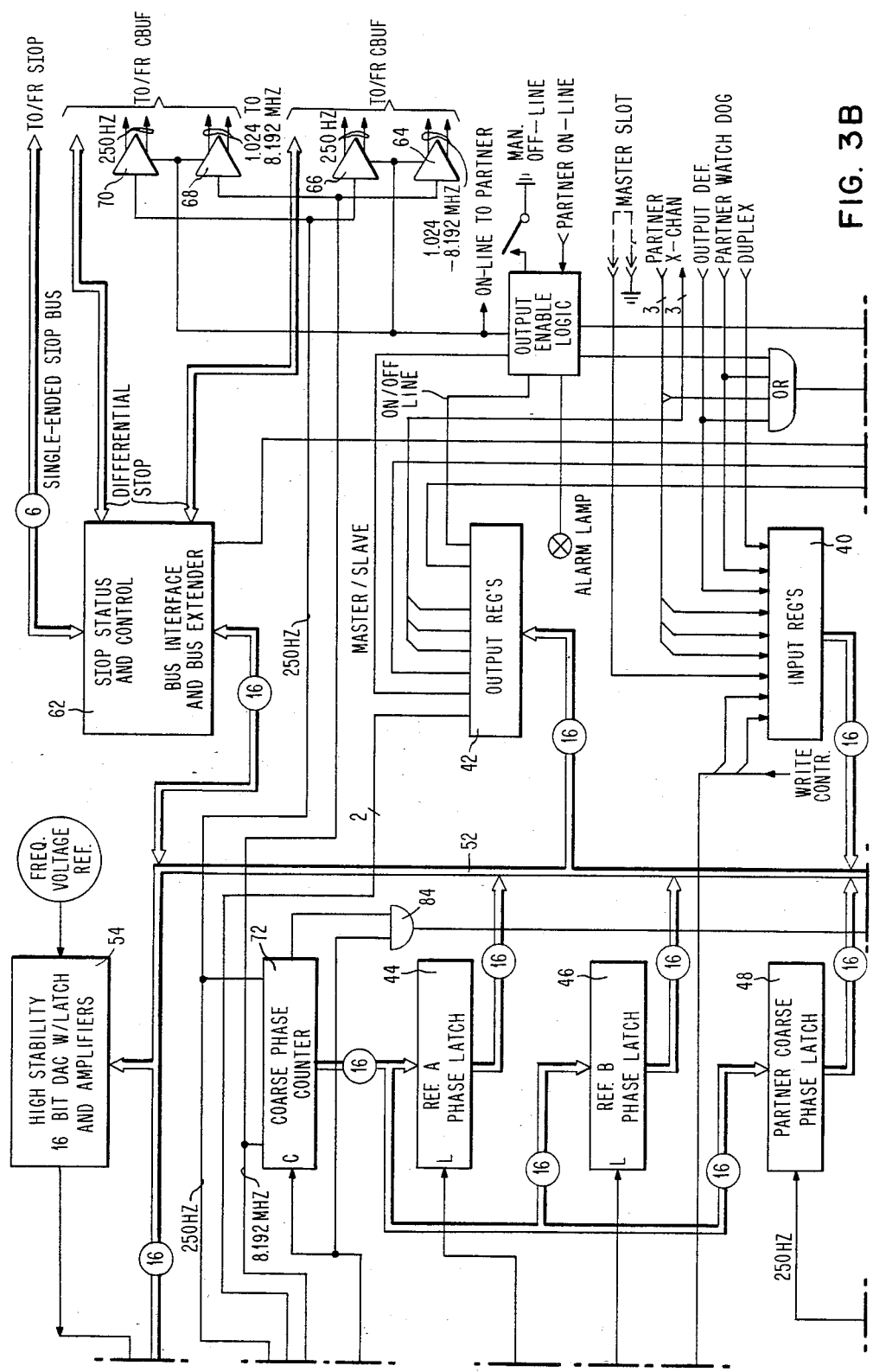
Figure 3D:
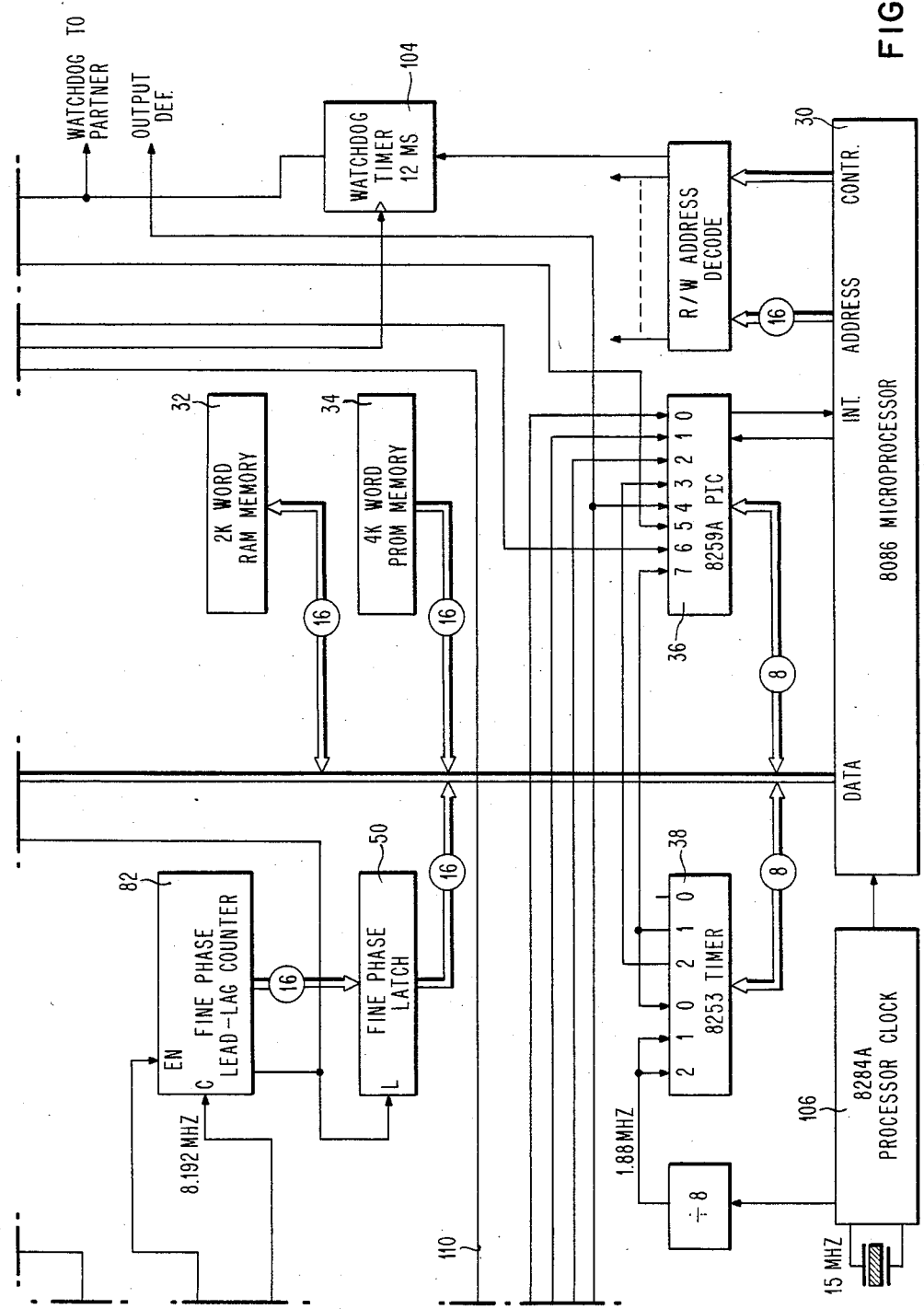

FIG. 3 is a key figure, comprising FIGS. 3A, 3B, 3C, and 3D. FIGS. 3A, 3B, 3C and 3D illustrate both an RCI module and a CCG module in detail. The partner RCI and CCG modules are identical. In the lower right-hand corner of this figure is an 8086 microprocessor 30 together with a RAM memory 32 and an EPROM memory 34. Associated with the microprocessor are also an 8259A priority interrupt controller (PIC) 36, an 8253 programmable timer unit 38 and input and output registers 40 and 42, respectively. All of these circuit components are available commercially from Intel Corp., Sunneyvale, California.

In addition to these conventional microprocessor type components, the circuit of FIG. 3 includes a number of phase measurement input registers or "latches" 44, 46, 48 and 50 which are connected to the 16 bit microprocessor bus 52. Also arranged on the bus are two 16 bit digital-to-analog converters (DAC's) 54 and 56 which control the TVCXO 58 and an ovenized VCXO 60. The DAC 56 and VCXO 60 are located in the RCI module 61.

In FIG. 3C may be seen a number of signal leads which interface one CCG to its partner, redundant CCG. In FIG. 3B may be seen the input/output status and control bus interface 62 of the CCG which receives commands and provides status to a central control processor via a status input/output processor (SIOP). On the upper right-hand side of the figure are indicated the dual clock (8.192 MHz) and sync (250 Hz) signals which constitute the operative output of the CCG. Dual, redundant output driver amplifiers 64, 66, 68 and 70 of the differential type are provided for the 8.192 MHz and 250 Hz signals.

At the top left of FIG. 3B is a "coarse phase counter" 72. This is a 16 bit synchronous type counter which serves two purposes: First, it is used to divide the output of the TVCXO 58 or VCXO 60 down from 16.384 MHz to 8.192 MHz and 250 Hz square waves. The 16.384 MHz signal is received from a two-to-one multiplexor 74. Second, the coarse phase counter is the source of a 16 bit resolution phase angle for measurement of the relative phases of the internal and partner 250 Hz references.

The coarse phase counter 72 drives the three coarse phase latches 44, 46 and 48. The latches 44 and 46 are for external synchronization reference phase measurements; the latch 48 or "partner coarse phase latch" serves for measurement of the phase difference between the own and the partner's synchronization reference signals. In principle, the measurements of the phase angle for the two external references is identical to that of measuring the coarse phase angle of the partner reference 250 Hz signal so that only the partner reference coarse phase and the corresponding fine phase measurements are described hereinbelow.

The coarse phase counter 72 may be thought of as a spinning disk with numbers written sequentially around its edge (from 0 to 65,535). If a very fast strobe light is used to illuminate one point at the edge of such a spinning disk and the frequency of the strobe matches the rotational frequency of the disk, only one of the 65,535 different numbers will be seen and that number will represent the phase angle relationship of the time of the strobe flash and the number 0 of the disk. The "strobe" of the CCG is represented by the leading (low going high) edge of the reference signal (250 Hz) and the image of the number seen on the disk is represented by the contents of the coarse phase latch 48 which indicates the position of the counter at strobe time.

To simplify timing matters, the respective coarse phase latch 48 is allowed to follow the state of the coarse phase counter 72 for half of the strobe period when the 250 Hz square wave is low; the latch then freezes or latches the instantaneous state of the coarse phase counter at the time that the 250 Hz square wave goes high. The latched state (count) of the counter 72 is then held in the latch 48 for the other half of the 250 Hz period while the 250 Hz square wave remains high.

At the time that the coarse phase latch 48 begins holding the coarse phase angle, an interrupt signal is sent to the 8086 microprocessor 30 via the programmable interrupt controller 36. The microprocessor then reads in the coarse phase angle from the latch 48 via the bus 52. This read operation occurs once every four milliseconds (250 Hz). After reading the microprocessor processes this data, as well as the fine phase measurement data which will be described next.

Since the coarse phase counter 72 changes state every 16.384 MHz clock cycle, the resolution of the coarse phase measurement is ±30.05 ns (in terms of time interval error). This would seem to be a very accurate phase measurement and it is quite adequate for measurements such as are needed for external synchronization. For cross-locking one CCG to the other, however, this is not accurate enough. For this reason, another method is provided, according to the present invention to measure a "fine phase" which is defined to be inside the ±30.05 ns coarse phase dead band.

A purely hardware description of the fine phase measurement apparatus will not reveal how the apparatus works and how the fine phase measurement is made, since part of the fine phase measurement is really a firmware function. However, an understanding of the nature and operation of the hardware is a prerequisite to understanding the firmware.

The fine phase measurement between a CCG and its partner starts with a "D" type flip-flop which is used to compare the phase relationship between the 8.192 MHz square wave reference signal received from the partner CCG to the own CCG 8.192 MHz square wave generated internally as the least significant bit of the coarse phase counter 72. This D type flip-flop is a 10131 latch 76 implemented in "emitter coupled logic" (ECL) and available commercially from the Fairchild Semiconductor Division, Sunnyvale, Calif. As is well known, ECL logic is significantly faster than the more commonly used "transistor-transistor logic" (TTL). ECL logic has long been used in main frame computers to achieve the faster possible switching rates.

Since the circuit shown in FIG. 3C is basically implemented in TTL logic, it is necessary to provide level converting and impedance matching amplifiers e.g. 81 on both sides of the ECL latch 76 to convert from TTL to ECL and from ECL to TTL. More particularly, the ECL logic used in the latch 76 and its associated amplifiers is the so-called "ECL-10K" logic.

As is shown in FIG. 3C, the internal (own) 8.192 MHz reference signal generated by the coarse phase counter 72 is supplied to the clock or "C" input of the latch 76. A short compensating delay is inserted by means of an ECL differential line receiver amplifier 78. Similarly, the 8.192 MHz reference signal from the partner is supplied to the "D" input of the latch 76 via an ECL differential line receiver amplifier 80. The amplifier 78 thus compensates for the delay introduced by the amplifier 80; amplifiers 78 and 80 are arranged on a common silicon substrate to insure that their delays are practically identical. As is well known a "D" flip flop or latch operates to take on the binary state of the signal applied to the D input when the clock signal applied to the C input goes high. In this case, if the state of the D input was low when the C input goes high, the partner reference signal is said to "lag" the internal reference signal, and if the D state was high at this instant it is said to "lead" the internal reference signal. As will be explained below, the amount of lead or lag can be determined by looking at the time behavior of the lead and lag.

The ECL fast phase measurement latch 76 may be thought of as providing successive "knife edge" comparisons between the leading (low going high) edges of the two 8.192 MHz reference signals applied to it. It determines which of the two signals of identical frequency leads the other in phase.

The Q output of the latch 76 is coupled through amplifier 81 to the enable input of a counter 82 called the "fine phase lead-lag counter". The clock or C input of this counter receives the 8.192 MHz reference signal from the coarse phase counter 72. The contents of this counter are continuously presented to the fine phase latch 50 which repeatedly latches the count every four milliseconds. The latch signal applied to the L input of the latch 50 and to the reset input of the counter 82 is a brief pulse, repeated every four milliseconds, which is generated by an AND gate 84 that receives both the carry signal from the counter 72 and the 16.384 MHz reference signal as inputs.

Each time the internal 8.192 MHz reference sets the latch 76 (i.e., the partner is leading) the fine phase lead-lag counter 82 is incremented by 1 on the trailing (high going low) edge of the clock pulse. This process continues over each four millisecond period of the internal 250 Hz reference signal until, at the end of each such period, the value in the fine phase lead-lag counter is latched into the fine phase latch 50. At this time, the counter 82 is reset and starts accumulating the next number of leading partner reference clocks for the next measurement.

When the CCG is exactly in phase with the partner to which it is locking, it is uncertain if the partner is leading or lagging. As with all such signals however there is a small amount of jitter (or phase noise) which is generally Gaussian distributed. This jitter produces (on the average) as many leading as lagging phase relationships between the internal and partner reference clocks. The result is that for such a condition there will result a fine phase count per four millisecond period which is half of full scale for the counter.

If every partner reference clock were leading, the count would reach 32768 per period. If every partner reference were lagging the counter would never count and would be zero for each such period. Half of full scale is 16384 counts and corresponds to a condition of half leading and half lagging or, on the average, of in phase.

The value in the fine phase counter is read in by the processor every 4 milliseconds at about the same time as the coarse phase data. The complete process of deriving the fine phase angle in terms of magnitude (not just leading or lagging) is somewhat more complicated and will be described next.

As mentioned above, the fine phase measurement's domain is inside of the dead-band of the coarse phase resolution ($\pm 30.05$ nanoseconds). Let us assume that the procedure for coarse phase correction has just been completed; that is, the coarse phase error has just become zero and the dead-band region has been entered. As soon as this occurs there is a transition to a different control algorithm in the microprocessor firmware. A frequency error function continues to drive the phase towards the other side of the dead-band region. As soon as the fine phase changes from leading to lagging or vice-versa (which will occur at the center of the dead-band) a square wave frequency modulation function is added to the DAC control 54 of the TVCXO 58 by the microprocessor 30. Since phase is the integral of frequency this causes a triangle wave sweep of the phase relationship between the two references.

The direction of the sweep described above is reversed at the end of each 4 millisecond period, thus causing a sweep frequency of 125 Hz. The amplitude of the sweep is started at a level high enough to insure traversal of the zero phase angle line.

The fine phase measurements now indicate how well the sweep is centered about the zero phase line. The starting amplitude of the sweep (peak to peak) in terms of time interval error is around 800 picoseconds.

The fine phase measurements are used as input to a proportional control path and an integral control path in the microprocessor firmware which are added together with the frequency offset function (coarse integral part) and the modulation function to control the TVCXO 58 via the DAC 54. This causes the sweep to become better and better centered about the zero phase line.

Each time a full cycle of sweep produces two zero phases crossings (a successful experiment) the sweep amplitude is reduced by a delta sweep factor. Each time a reversal of sweep does not produce a zero phase crossing (a failed experiment) the sweep is not reversed and the sweep amplitude is increased by a delta sweep factor.

As the sweep becomes better centered over the zero phase line the sweep amplitude reduces very rapidly to a minimum value of about 25 picoseconds peak to peak. At this level it is less dominant than the gaussian jitter which is around 120 picoseconds peak to peak.

When the sweep amplitude is maximum the resolution of the fine phase measurements is 800 ps/32768 or 2.44 E-14 seconds per one bit change. At minimum amplitude the resolution increases to 25 ps/32768 or 0.76 E-15 seconds. This resolution is of course only practical on the basis of averages but is quite feasible on the basis of the thousands of samples which make up each measurement.

It should be noted that it is not possible to determine the direction of phase drift for a measurement which results in a crossing of the zero phase line. It is only when a measurement result is combined with the control that caused the zero crossing that the direction of the crossing is clear. Also, if for some reason, such as a sudden change of frequency or phase by the partner, a double crossing of the zero line occurs between control changes, the apparent direction could be reversed from the actual direction.

The remaining hardware of the CCG and RCI modules shown in FIGS. 3A, 3B, 3C, and 3D will now be described. The two external reference signals, REF A and REF B, are applied to inputs in the RCI module 61. These reference signals may be either RS422 standard inputs or may be received from a remote location and require signal conditioning. In the latter case, the reference signals may be either in the form of a sine or square wave and may have a signal strength in the range of 0.3 to 3 V RMS.

RS422 signals are applied to amplifiers 84, whereas the non-standard signals are applied to shielded inputs 86 which are connected to signal conditioners and isolators 88. Manually operable switches 90 and 92 select the appropriate one of the standard or non-standard input for REF A and REF B, respectively.

The reference signals, both REF A and REF B must be divided down to a standard frequency of 250 Hz. Since the reference signal has a frequency in the range of 1 KHz to 16.384 MHz, the frequency division is effected by two 16 bit divide by N counters 94. The number N is selected by grounding various preset inputs of the counters 94 by means of switches 96.

Two alarm signals are both generated and received by the CCG. An "output defective" signal is generated by alarm logic 98 which receives inputs from two clock loss alarm detectors 100. These detectors produce an output upon failure of either the 8.192 MHz clock signal or the 250 Hz sync signal, respectively. These clock and sync signals are gated through to the clock loss alarm detectors 100 by an "alarm test" signal supplied on line 102 from one of the output registers 42. The alarm sequence is thus controlled by the microprocessor 30. If the alarm logic 98 receives an output signal from one of the detectors 100, it passes an "output defective" signal to the program interrupt counter 36 and to the partner CCG.

A second "watch dog" alarm signal is generated by the CCG of FIG. 3 and received from its partner. This watch dog signal is produced by a 12 MS timer 104 which must be periodically "stroked" or reset by the microprocessor 30. If the timer is not reset within a 12 MS period, it "runs out" and generates a watch dog output signal indicative that the microprocessor is not proceeding along the proper program pathway.

The "output defective" signal and watch dog signal received from the partner CCG are supplied to respective input registers 40 and read into the microprocessor during the next cycle. The microprocessors of both CCG's respond to these warning signals by taking the following action:

(1) If the two CCG's are crosslocked and in the duplex mode, the microprocessors disable the clock output of the CCG which generated the warning signal, leaving the other CCG on line and in the simplex mode.

(2) If the CCG which generated the warning signal is on line and in the simplex mode, its microprocessor freezes the contents of its DAC to prevent further drift and stays on line.

The 8086 microprocessor 30 is driven by an 8284A processor clock 106 operating at 15 MHz. The 15 MHz clock signal is divided by 8 to provide an 1.88 MHz timing signal for the 8253 timer 38.

The program interrupt counter 36, which controls the interrupts for the microprocessor 30 receives timing or clock signals from the timer 38, an interrupt input from the SIOP status and control bus interface 62, the "output defective", "watch dog" and "duplex mode" signals from the partner, the "output defective" signal from the alarm logic 98, the 250 Hz external reference signals REF A and REF B, and a 250 Hz signal from a two-to-one multiplexor 108. This multiplexor 108 receives one 250 Hz signal from the coarse phase counter 72 and another from the partner and selects one for output in dependence upon a control signal on a line 110 connected to one of the output registers 42. In this way, the microprocessor 30 can control the selection of either the CCG's own or its partner's sync signal as an interrupt signal.

Figure 4:
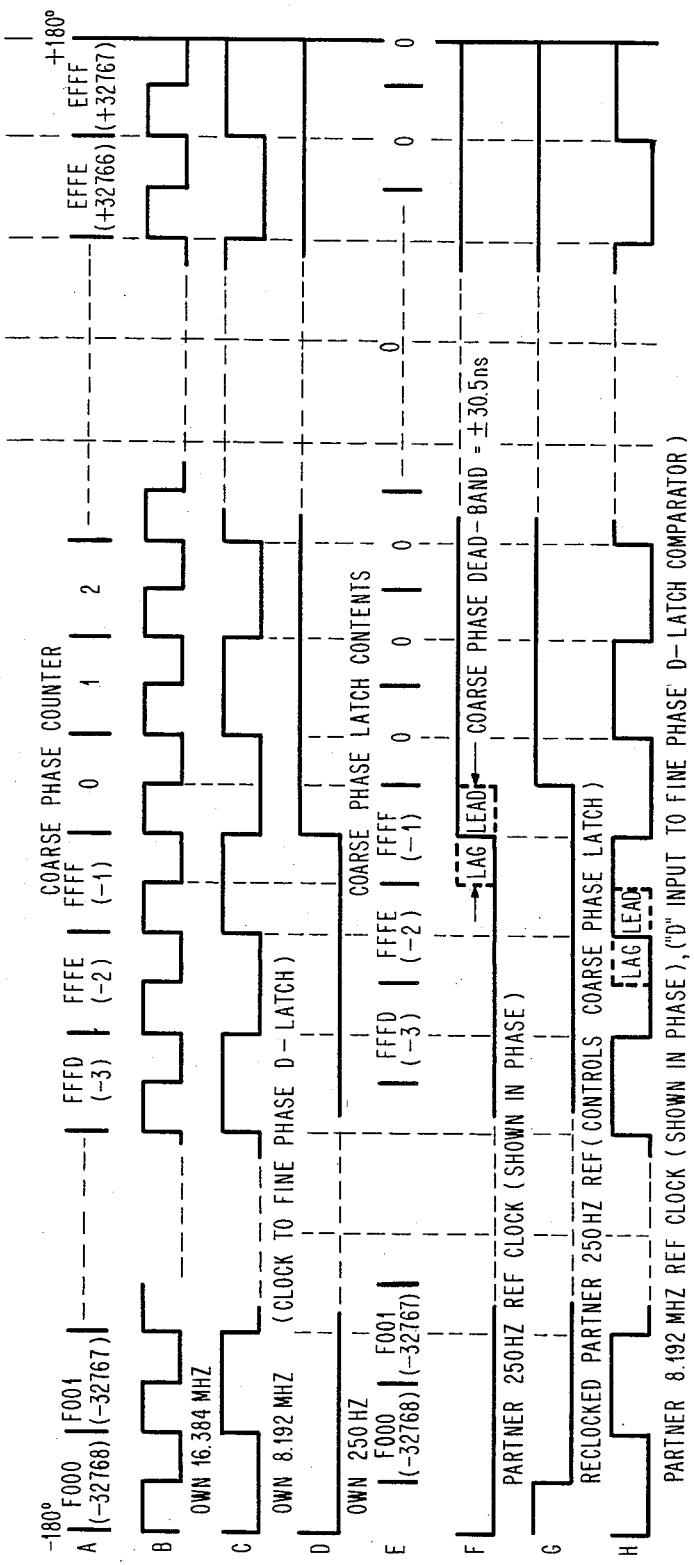
FIG. 4 is a timing diagram illustrating the operation of a CCG.

Operation of the CCG shown in FIGS. 3A, 3B, 3C, and 3D is illustrated in FIG. 4. The continously running coarse phase counter 72 is incremented (line A) by the trailing edge of the 16.384 MHz clock signal received from either the TVCX0 58 or the ovenized VCX0 60 (line B).

The coarse phase counter 72 divides the input clock signal by two to produce the 8.192 MHz signal (line C) for input to (1) the fine phase lead-lag counter 82 (2) the fine phase D latch 76 for phase comparison and (3) to the partner CCG as a crosslock signal. The coarse phase counter 72 also generates the 250 Hz signal (line D) which is also passed to the partner CCG as a crosslock signal.

The contents of the coarse phase counter 72 are passed to the coarse phase latch 48 one half cycle after the coarse phase counter is incremented (line E). The coarse phase latch is "strobed" and its contents are frozen upon receipt of a low-to-high transition in the partner 250 Hz reference input signal (line F). The period of time in which each count remains in the coarse phase latch 48 defines the coarse phase dead band which is approximately 61 ns wide.

Since the coarse phase latch 48 follows the coarse phase counter 72 with a delay of 15.25 ns, its Output would appear to shift the partner's 250 Hz reference signal by the same amount (line G).

Finally, the partner's 8.192 MHz reference signal, which is supplied to the D latch 76, may also have a low-to-high transition anywhere within the dead band (line H).

Figure 5:
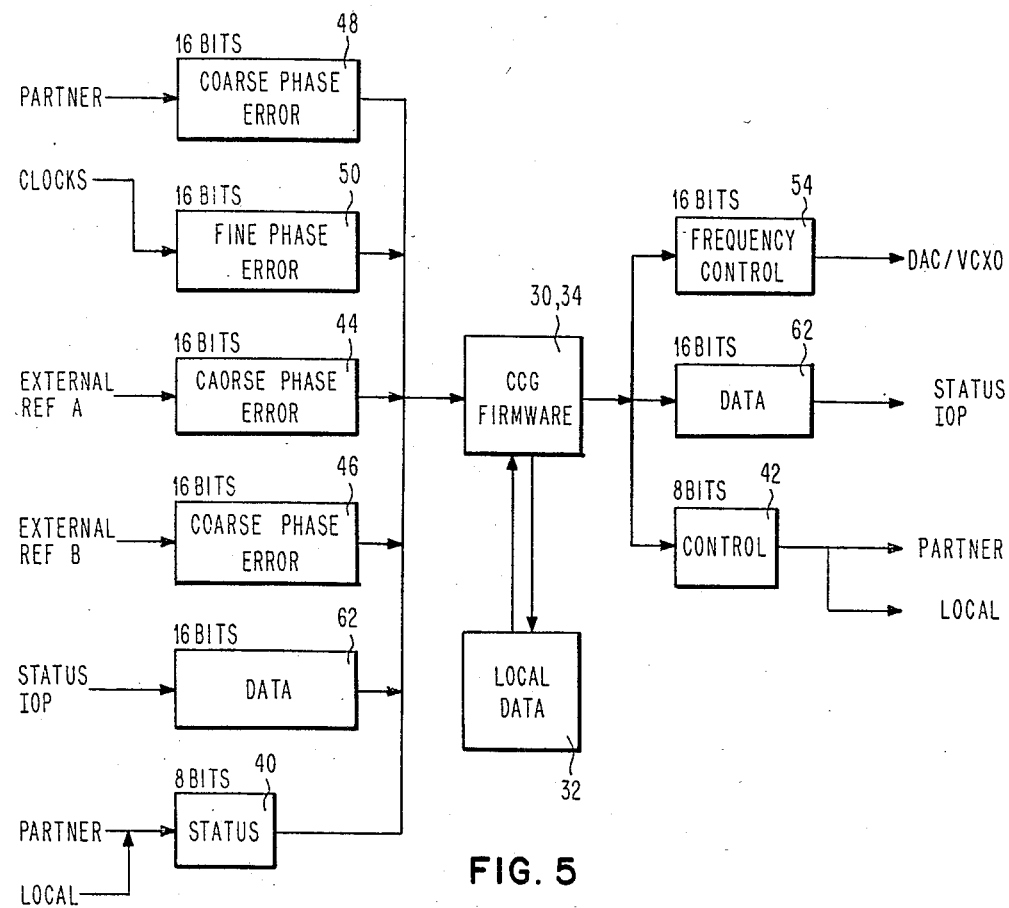
FIG. 5 is a block diagram illustrating the data flow in a CCG.

FIG. 5 illustrates the data flow within the CCG of FIG. 3. As may be seen, the CCG firmware in the PROM 34 controlling the microprocessor 30 receives data concerning (1) the coarse phase and (2) fine phase error with respect to the partner, (3) and (4) the coarse phase error with respect to the external reference signals REF A and REF B, (5) control data from the status input/output processor (SIOP) and (6) status data from the partner as well as the own CCG. The firmware processes this information, storing data as necessary in a scratchpad RAM 32, and outputs (1) frequency control data to the DAC for controlling the VCX0, (2) status data for the SIOP and (3) control data for both the own and the partner CCG.

Figure 6:
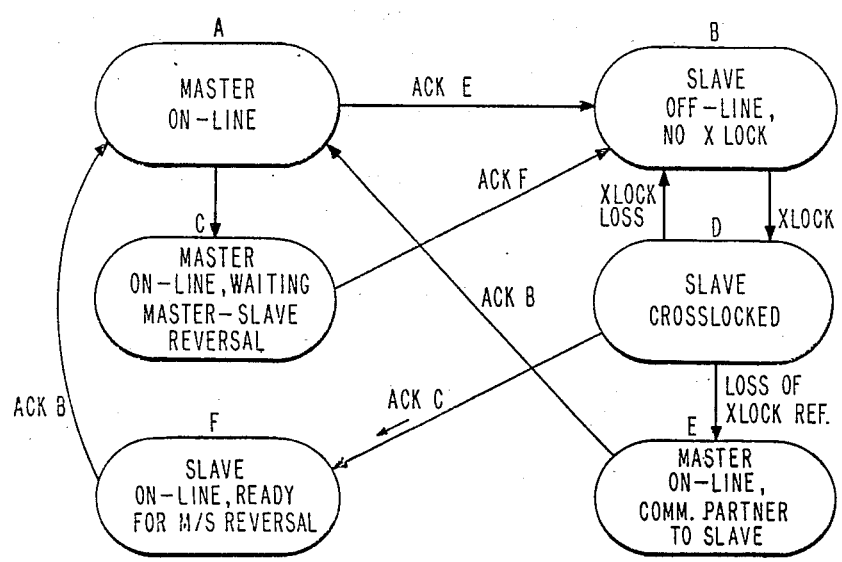
FIG. 6 is a state diagram illustrating the modes of operation of the clock system of FIG. 1.

FIG. 6 is a state diagram illustrating how the two identical, partner CCG's operate in master/slave relationship, and change this relationship, as necessary, to meet various circumstances in real time. The various states of operation are as follows:

A. The master CCG is "on-line"; that is, supplying clock signals to a telecommunication system, computer system or the like.

B. The slave CCG is "off-line" and not crosslocked to the master CCG. It is either acquiring crosslock or it is unable to crosslock for some reason.

C. The master CCG is on-line; however, it is ready for a master/slave reversal.

The master CCG has instructed the slave to go on-line by means of timing and control signals and is waiting for an acknowledgment from the slave CCG.

D. The slave CCG is crosslocked to the master CCG.

E. The master CCG is on-line and is commanding its partner to become a slave CCG. The master CCG has produced timing and control signals and is waiting for an acknowledgment from the slave CCG.

F. The slave CCG is on-line and is ready for a master/slave reversal. The slave CCG has produced timing and control signals and is waiting for an acknowledgment from the master CCG.

In normal operation, one of the two partner CCG's will be in state A (master, on-line) and the other CCG will be in state D (slave, crosslocked to the master). From this operating condition, the slave CCG can be brought to state B (slave, off-line, no crosslock), for example for testing and/or repair, and then brought back to state D If the slave CCG detects a failure in the master CCG, for example in that the crosslock reference signal is lost, the slave may move from state D to state E where it assumes the position of master, on-line, and commands its partner (the old master) to become a slave. Upon receiving such a command, the old master moves from state A to state B, acknowledging the command to the new master. When it becomes a slave, the old master so informs the new master which, in turn, acknowledges the signal and moves from state E to state A. Thereafter, the new slave in state B may be repaired and eventually brought into crosslock with the master (state D).

Upon command, the master and slave CCG;s may reverse their roles in the following manner:

The master, which is originally in state A, moves immediately to state C and commands the slave (in state D) to go on-line. The slave then moves from state D to state F, acknowledging the command from the master in state C, and informing the master when it arrives at state F. Thereafter, the master moves from state C to state B, acknowledging the signal from the slave in state F and informing the slave when it arrives in state B. Finally, the slave moves from state F to state A, becoming the new master, and acknowledges to the new slave (the old master) that it has done so.

The states of operation described above provide flexibility in responding to various failure conditions. As described in the "Summary of the Invention", it is possible for failures to occur in either one of the two CCG's or in either one of the two external reference signals. No matter where the failure may arise, it is possible to maintain the clock system in operation with one of the two CCG's on-line, and then to identify and repair the defective equipment.

Figure 7:
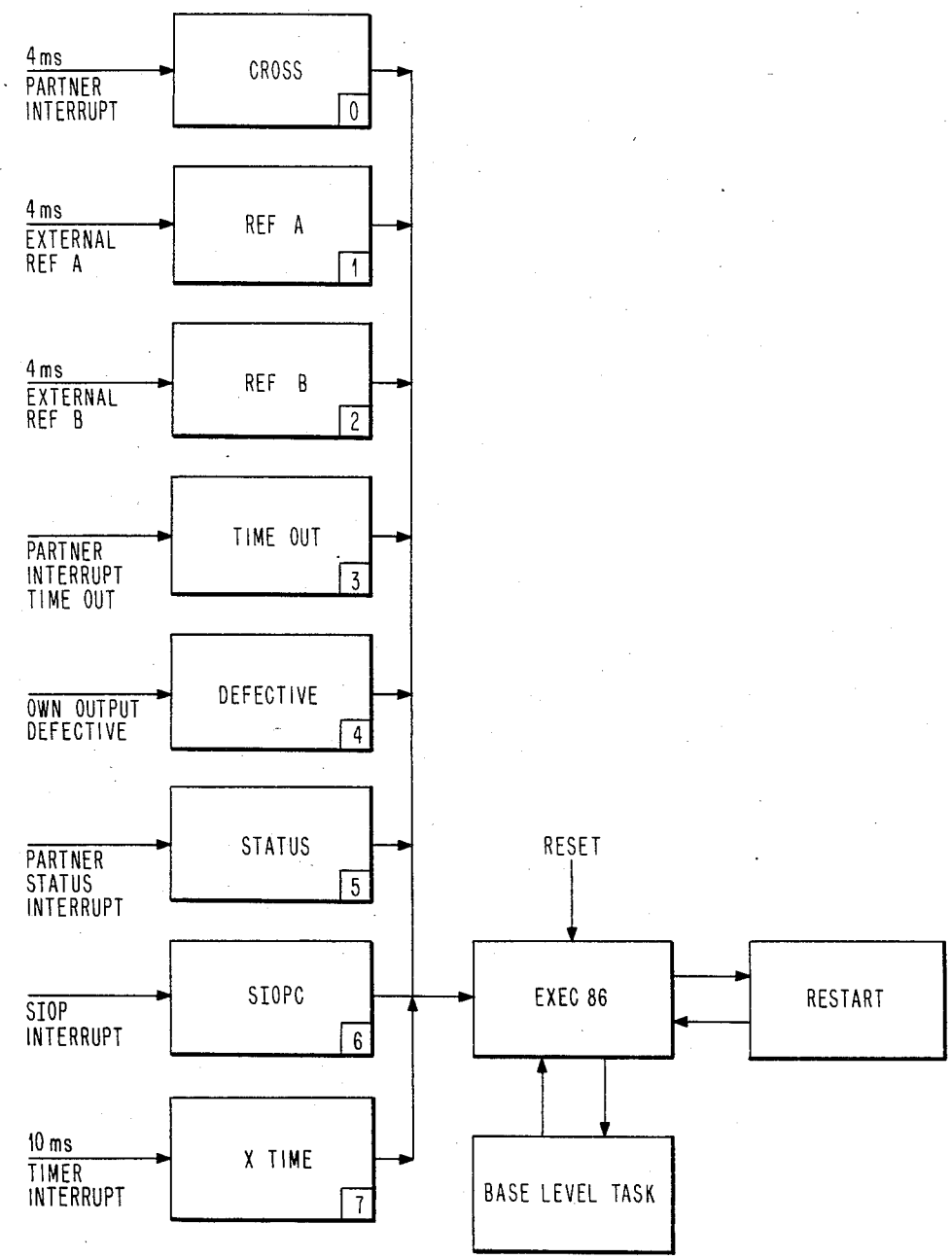
FIG. 7 is a block diagram showing the firmware routines employed in a CCG.

FIG. 7 is a block diagram of the firmware for the microprocessor 30. The various interrupt routines namely CROSS, REF A, REF B, TIMEOUT, DEFECTIVE, STATUS, SIOPC and XTIME are initiated by input signals received at one of the seven inputs of the PIC 36. After execution of an interrupt routine, control is transferred to the main program EXEC 86 which continues to execute base level tasks until the next interrupt. The respective input ports of the PIC 36 associated with each interrupt routine are indicated in the lower hand corner of the block representing that routine. Thus, the interrupt routine CROSS is initiated by the appearance of the leading edge of a 250 Hz square wave applied to the input port 0 of the PIC 36.

The firmware for the microprocessor 30 is specified by the object code listings provided in the microfiche appendix which contains 20 frames. The description of this firmware which follows is intended to assist the reader in understanding the operation of the RCI and CCG according to the invention; however, reference should be made to this Appendix for specific details.

As explained above, the two partner RCI/CCG modules are identical in both hardware and firmware. Either module may become the "master" and the other the "slave". The master unit is that RCI/CCG which either follows one of the external reference clock signals REF A or REF B or "coasts"; i.e., it follows its own TVCXO 58 or ovenized VCX0 60 with the setting of its controlling DAC 54 or 56 frozen. The slave unit receives and continually monitors the external reference signals and stands in readiness to become a master; however, it closely follows the frequency and phase of its master partner. The slave CCG executes a frequency and phase locking algorithm that is so accurate, in fact, that the instantaneous phase—time variation (the time rate of change of the phase difference) between the slave and master, when crosslocked, does not exceed about 30 picoseconds (ps), which is the jitter noise level of the slave clock signal, and the average phase-time variation over a few seconds time is zero.

Figure 8:
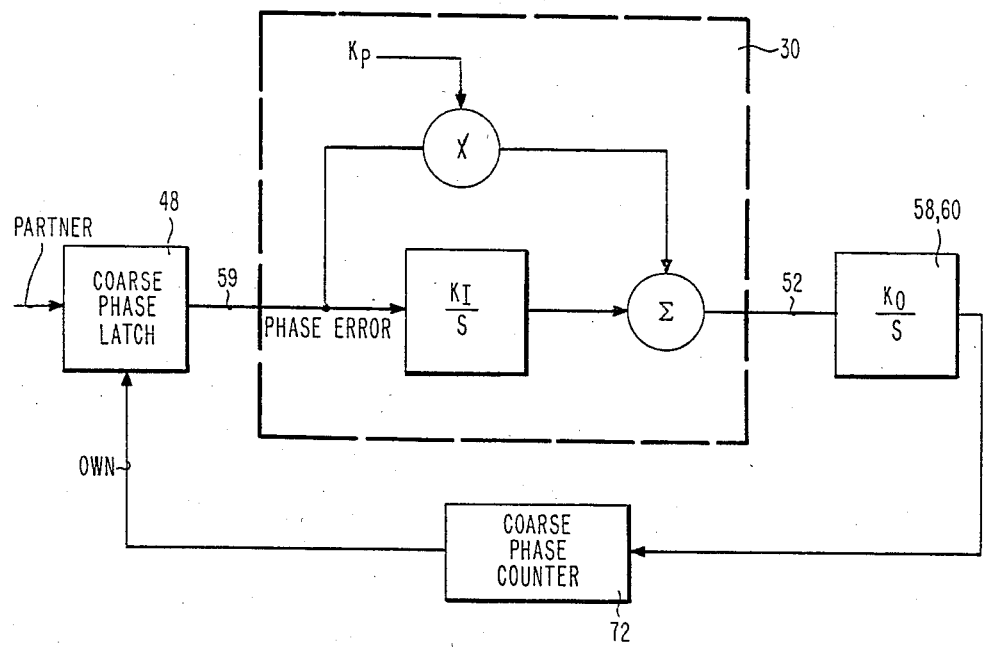
FIG. 8 is a block diagram illustrating the basic control loop employed in a CCG.

The coarse phase locking system of the slave CCG operates continuously, with a negative feedback control algorithm, to bring and maintain the phase difference between the slave and master clock signals to within the ±30.5 ns dead-band of the slave unit coarse phase counter (coarse phase error equals zero) even though the frequency of the master clock signal may vary because the master CCG follows the outside reference clock signal Ref. A or Ref B. This coarse phase locking system is illustrated in FIG. 8. With this system the difference in phase between the 8.192 MHz clock signals of the two partners is measured every 4 ms by the contents of the coarse phase latch 48. The phase error is supplied via the bus 52 to the microprocessor 30 which performs an integration with a constant $K_I$ and sums the result with the phase error multiplied by another constant $K_p$. The output control signal is passed, also via the bus 52, either to the DAC 54 and TVCXO 58 or to the DAC 56 and ovenized VXCO 60. The voltage controlled crystal oscillator serves as a second integrating stage with an integration constant $K_0$. The output of this oscillator is divided down by the coarse phase counter 72 and passed to the coarse phase latch 48 for phase regulation.

Figure 9:
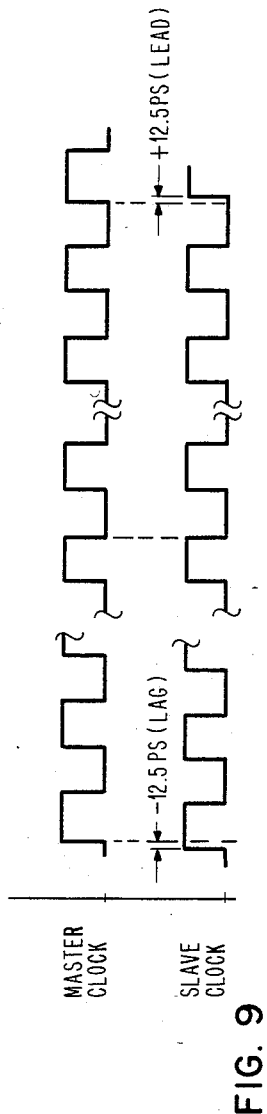
FIG. 9 is a timing diagram showing the output clock signals of two crosslocked CCGs.
Figure 10:
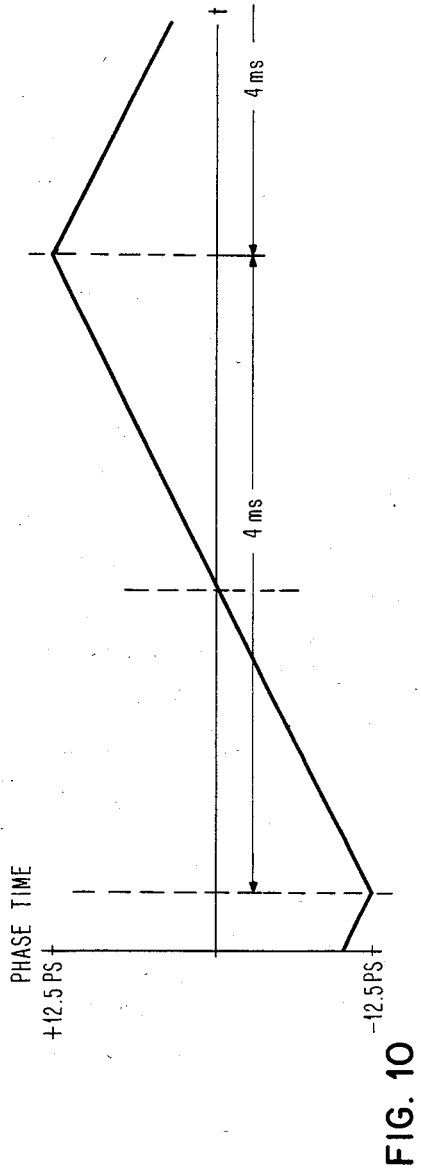
FIG. 10 is a phase-time versus time diagram showing the phase difference between two crosslocked CCGs.
Figure 11:
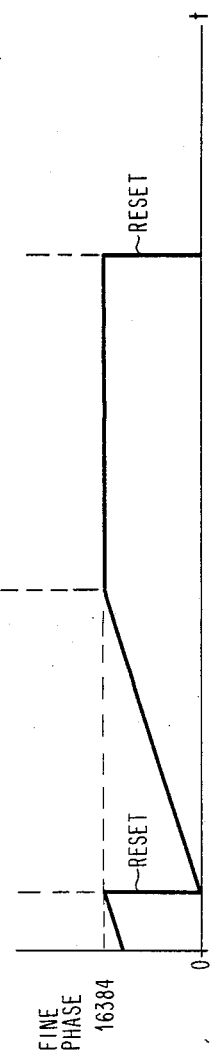
FIG. 11 is a diagram of fine phase lead-lag count versus time for two crosslocked CCGs.

The procedure for fine phase regulation within the deadband is illustrated in FIGS. 9–11. After the master and slave CCGs have been crosslocked—that is, when the difference in phase between the two partners has been reduced to the jitter noise amplitude—"modulation scanning" is used to sweep the phase of the slave, with respect to the master clock signal, back and forth about the phase coherent point. More particularly, the phase of the slave clock signal is scanned every 4 ms (1/250 Hz) from either a leading position to a lagging position with respect to the master or vice versa, thus producing a sweep frequency of 125 Hz. During each sweep the number of cycles that the 8.192 MHz clock signal of the slave leads that of the master is counted and this number is compared to the number of cycles that it lags. If the number of lead cycles equals the number of lag cycles, it may be assumed that the clock signals of the slave and master were exactly in phase during the mid-point of the sweep.

FIG. 9 illustrates 8.192 MHz clock signals of a master and slave CCG. The frequency of the master clock is held fixed while the phase of the slave clock is scanned with respect to the master clock. For the purpose of clarity and ease of understanding, jitter noise, which appears in both signals in practice, is ignored and not shown. Initially, the slave clock signal lags the master clock signal by 12.5 ps. The slave clock is controlled to have a slightly higher frequency than the master clock so that, by the end of a 4 ms interval, the slave clock leads the master clock in phase by 12.5 ps. At some time between the beginning and end of this 4 ms interval, the slave clock and master clock signals are exactly phase coherent.

The "phase time"—that is, the phase angle measured in units of time—between the slave and master clock signals is diagrammed in FIG. 10. As may be seen, the phase difference between the two clock signals increases linearly during the 4 ms scanning interval, and thereafter decreases linearly during the next 4 ms interval, producing a sweep frequency of 125 Hz.

FIG. 11 shows the contents of the fine phase lead-lag counter 82 during the modulation scanning process. This counter counts from zero to a maximum count of 32,768 which it holds until it is reset. When reset by a pulse from the AND gate 84, the lead-lag counter starts counting from zero again. As mentioned above, the lead-lag counter counts 8.192 MHz pulses only when enabled by a "lag" signal from the ECL latch 76; i.e., when the slave CCG clock signal lags the master clock signal. Consequently, the contents of the counter will increase from zero until it reaches some number at the time that the two clock signals are phase coherent. Thereafter, the contents of the counter will remain constant until reset to zero at the end of the 4 ms interval. At the time of reset, the contents of the fine phase counter 82 are stored in the fine phase latch 50 and held therein during the subsequent 4 ms interval for reading by the microprocessor 30.

If, as continuously happens in practice, signal jitter results in a high or low count in the fine phase counter 82 at the time it is latched into the fine phase latch 50, the microprocessor firmware adjusts the digital number supplied to the DAC 54 or 56 so as to control the frequency of the TVCXO 58 or the VXCO 60, respectively, in an attempt to maintain the count at the center number 16,384.

Figure 12:
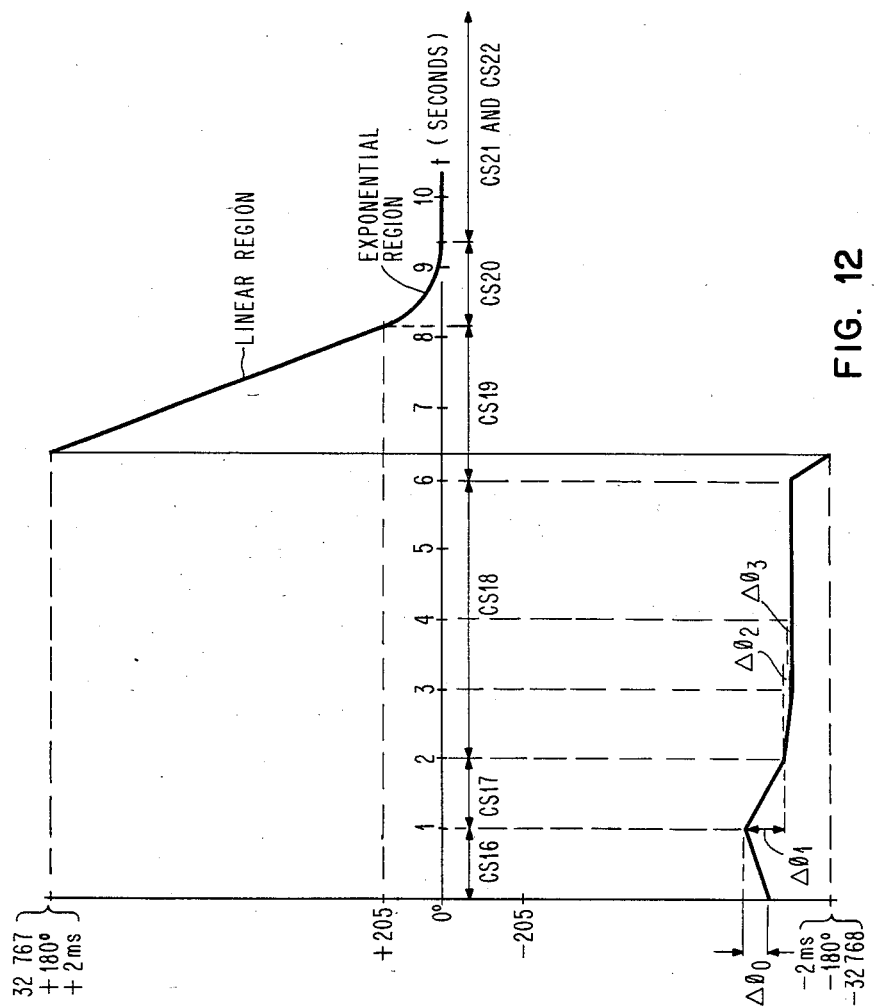
FIG. 12 is a diagram of fine phase lead-lag count versus time of a slave CCG which is attempting to reach phase synchronism with a master CCG.

Having explained the coarse phase locking procedure and the procedure for maintaining fine phase lock, it remains to be discussed how the slave CCG proceeds from the unlocked state—for example, at startup—to the state of fine phase lock. FIG. 12 is a diagram of phase difference vs. time showing the phase of the slave CCG clock signal with respect to that of the master CCG. The phase scale extends over a 360° angle (±180° about 0°) and the time scale extends over an initial period of 10 seconds. The crosslocking procedure is carried out by a number of firmware routines reflecting different crosslock states CS 16, CS 17, CS 18, CS 19, CS 20, CS 21 and CS 22 (for the CCG mode of operation) which are successively called to carry out individual phase locking tasks.

Assume that at a time $t=0$ the master and slave CCGs are powered and operating at approximately the same frequency; however, their 8.192 MHz clock signals are at an arbitrary phase relationship with respect to each other. As noted above, the master unit operates with a constant frequency during the crosslocking procedure while the slave CCG runs through six successive crosslocking routines CS 16–CS 21 to reach a seventh routine CS 22 which maintains the crosslocked state by the modulation scanning procedure described in connection with FIGS. 9–11. Since both CCGs are capable of serving either as a master or a slave, the firmware is stored in, and available for use by each unit.

The first requirement in the crosslock procedure is to measure the "gain" of the slave CCG with its DAC 54 or 56 set at its maximum positive number and thereafter at its maximum negative number (the 16 bit DAC has a range of $-32768$ to $+32767$) with the DAC of the master CCG set at its mid-point (zero setting). To accomplish this, the routine CS 16 in the slave CCG sets the DAC to $+32767$, thereby reducing the frequency of the slave CCG clock signal slightly so that the phase angle $\phi$ of this clock signal will drift with respect to the phase of the master CCG clock signal. As shown in FIG. 12, this phase drift is allowed to continue for 1 second, whereupon the total phase drift $\Delta\phi_0$ is stored. The slope of the function $\phi$ for the maximum positive DAC setting is:

$$\text{Frequency difference} = d\phi/dt = \Delta\phi/\Delta T = \Delta\phi_0/1 = \Delta\phi_0$$

The frequency difference of the system between the master and slave which is achievable by the maximum DAC setting of the slave is therefore a positive or negative number $\Delta\phi_0$.

This same procedure is repeated by the second routine CS 17 for the maximum negative setting of the DAC. The frequency difference with this setting is therefore measured to be a positive or negative $\Delta\phi_1$.

The phase drifts $\Delta\phi_0$ and $\Delta\phi_1$ for maximum positive and maximum negative DAC settings, respectively, normally have opposite signs. If it is determined that both $\Delta\phi_0$ and $\Delta\phi_1$ have the same sign, the frequency of the master is completely outside of the control range of the slave. This is a condition which may occur after one or both units have aged considerably. In this case, the DAC of the master CCG is ramped slowly to either its maximum positive or maximum negative setting (depending upon the sign of $\Delta\phi_0$ and $\Delta\phi_1$ and then the routines CS 16 and CS 17 are run again. If the new phase drift values $\Delta\phi_0$ and $\Delta\phi_1$ also have the same sign, the slave unit knows it cannot lock to the master and it terminates the locking procedure.

Figure 13:
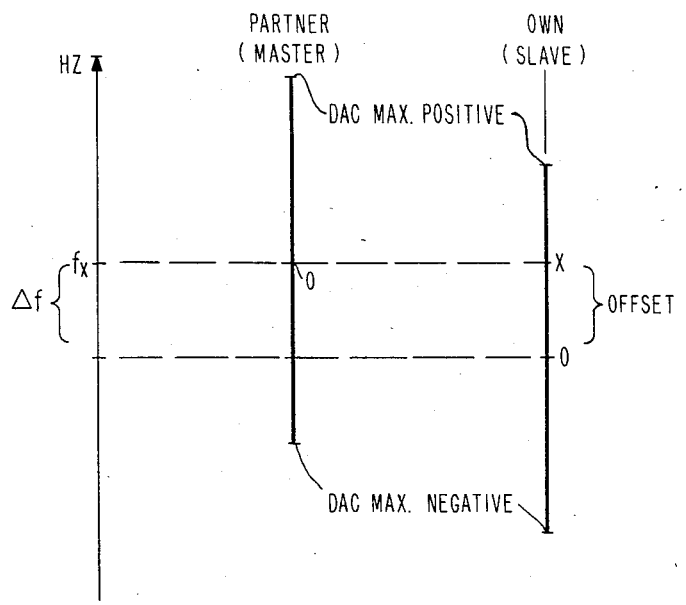
FIG. 13 is a frequency diagram showing the frequency control range of two CCGs.

Having found the gain $\Delta\phi_0$, $\Delta\phi_{11}$ with the slave unit DAC set at its maximum positive and maximum negative numbers, respectively, and the DAC of the master CCG set at 0, the next task is to compute the "offset" of the slave unit DAC; that is, the positive or negative DAC setting which produces the least phase drift between the master and slave. FIG. 13 illustrates the DAC range for both the own (slave) CCG and the partner (master) CCG. When the DAC of the master CCG is set at 0, in this example the DAC of the slave unit must be set at some positive number x to prevent phase drift between the master and slave clock signals. At these DAC settings, 0 and x, respectively, the master and slave clocks operate at nearly the identical frequency $f_x$.

In order to determine the offset frequency $\Delta f$ between (1) the slave clock frequency when the slave unit DAC is set at 0 and (2) the frequency $f_x$, the next routine CS 18 uses the following formula:

$$\Delta f = -32768(\Delta\phi_0 + \Delta\phi_1)/|\Delta\phi_0| + |\Delta\phi_1| \qquad (1)$$

This formula assumes that the relationship between frequency and DAC setting in the slave CCG is linear. In practice, however, it is not linear so that two or three successive approximations must be made to approach the offset frequency $\Delta f$.

Figure 14:
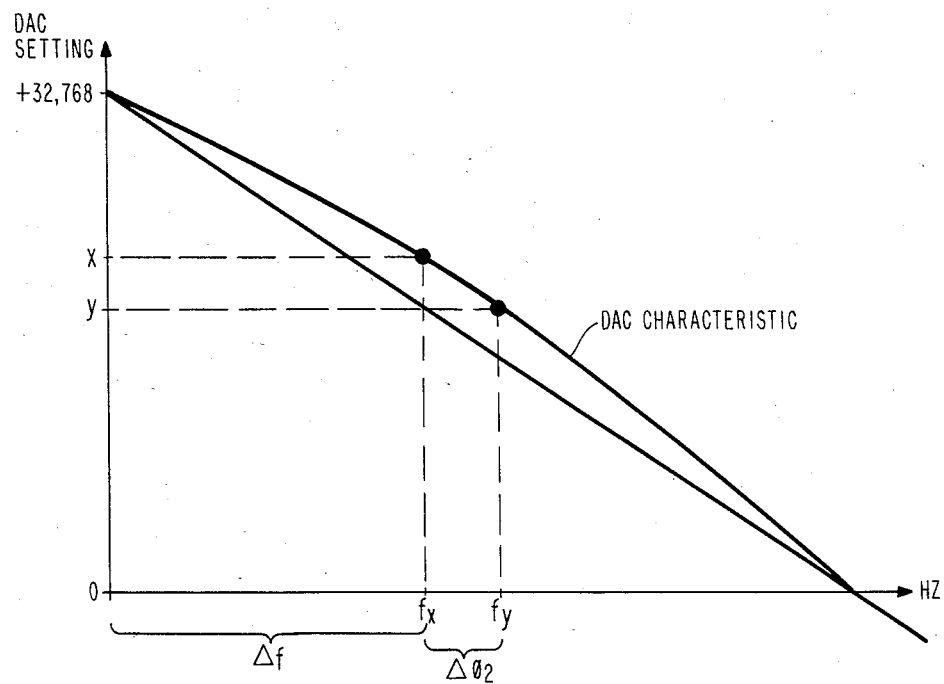
FIG. 14 is a diagram of DAC setting versus frequency for a CCG.

FIG. 14 illustrates how the offset frequency is successively tested in the routine CS 18 to find the DAC setting x which produces the frequency $f_x$ of the master CCG, when the master unit DAC is set at 0. The initial offset frequency is calculated according to the formula (1) above. This produces a DAC setting y which would result in the frequency $f_x$ if the DAC were linear. However, as shown in FIG. 14, the DAC characteristic is not linear so that the setting y results in a frequency $f_y$.

The routine CS 18 sets the DAC at the number y for one second and measures the phase change $\Delta\phi_2$. If $\Delta\phi_2$ is greater than 1 (coarse phase counter units), then a new trial DAC setting is calculated using the formula:

$$x = y + \Delta\phi_2 \cdot 65536/|\Delta\phi_0| + |\Delta\phi_1| \qquad (2)$$

This approximation procedure is continued several more times until $|\Delta\phi_1|$ becomes less than 1.

After the routine CS 18 determines the slave unit DAC setting x which results in the offset frequency $\Delta f$ and the absolute frequency $f_x$—that is, when the slave has effected frequency lock with the master—control is passed to the routine CS 19 which initiates the procedure for effecting phase lock.

The routine CS 19 initially determines the fastest way to move the phase of the slave clock signal into coherent relationship with the phase of the master clock; i.e. to reduce the phase difference to 0. The routine CS 19 calculates the time it would take to reach phase lock with the DAC of the slave unit set at its maximum positive value (one direction towards lock) and at its maximum negative value (the opposite direction towards lock). This calculation is made using the following formula:

$$T = d\phi/dt \cdot \Delta\phi \qquad (3)$$

where d$\Delta$gain $\Delta\phi_0$ or $\Delta\phi_1$ with the DAC set at its maximum positive or maximum negative value, respectively and $\Delta\phi$ is the angular distance towards lock in the particular direction of phase change.

The results of these two time calculations for maximum positive and negative settings of the slave unit DAC are compared and the shortest time is selected. Particularly in the case where the master and slave CCGs have aged, the gain $\Delta\phi_0$ or $\Delta\phi_1$ for one of the maximum DAC settings may be very small so that it would take a long time to achieve phase lock with such a setting.

After the direction of phase change is selected, the DAC setting is changed to its maximum positive or negative value to move the phase difference to zero as rapidly as possible. FIG. 12 illustrates a fast phase change resulting from setting the DAC at its maximum negative value (32,767). The rate of change of phase of the slave clock signal with respect to the master clock signal is linear during this period (shown as the period between t =6 and t =8.2 in FIG. 12). As the phase difference approaches 0 the number stored in the coarse phase latch will become progressively closer to 0. When this number is equal to or less than ±205, corresponding to a phase difference of about 50 microseconds, the routine CS 20 is called. This routine changes the DAC setting to the following time dependent function:

$$DS = K_p \cdot CPC + OV \qquad (4)$$

where DS is the DAC setting of the slave unit which is continually updated, $K_p$ is a proportionality constant, CPC is the instantaneous coarse phase count (as read from the latch) which is repeatedly reduced from ±205 towards zero, and OV is the offset DAC setting x.

These changes in the DAC setting DS by the routine CS 20 brings the phase difference between the two clocks toward zero in a negative exponential curve, as shown in FIG. 12. CS 20 continues this procedure until a zero is strobed into the coarse phase latch from the coarse phase counter (CPC =0). The phase difference between the master clock signal and the slave clock signal has thus reached the coarse phase deadband where the two clock signals are 30.5 ns or less apart in phase. When this occurs, the value CPC in the formula (4) is set equal to 1 to maintain the change of phase in the same direction, and control is shifted to the routine CS 21 which continues the fine phase locking procedure.

The routine CS 21 sets the number DS in the DAC of the slave unit equal to constant $K_1$ plus the offset value so that:

$$DS = K_1 + OV, \qquad (5)$$

where OV is the offset value x of the DAC (the DAC setting which results in minimal phase change between the slave clock signal and the master clock signal). This DAC setting DS assures that the phase difference between the slave and master clock will continue to change, within the deadband, until it reaches zero. Because the constant $K_1$ is not time dependent, this phase change will be linear.

The routine CS 21 monitors the contents of the fine phase latch to determine the phase relationship within the deadband. In particular, the count in the fine phase latch will be less than the full count 32768 at the end of the four millisecond interval when crossing from one side or greater than 0 when crossing from the other side if, during that interval, the phase relationship has passed through 0. When the routine CS 21 determines that the phase relationship has reached 0, it sets an "I" flag equal to 1 which brings in another portion of the formula for DS.

Therefore, prior to the first zero crossing of the phase relationship, the DAC setting DS is fixed at a constant value determined by the formula (5) above. After the first zero crossing, the formula becomes:

$$DS = K_1 + OV + I \cdot INT \text{ (fine integral + fine proportional part + sweep + 0 .5)} \qquad (6)$$

and is recalculated every 4 ms. In this formula

OV = DAC setting for the offset frequency (a constant);

The new "fine integral" = the old fine integral (determined in the previous calculation time frame) plus K4 times the new fine phase angle $\phi$;

The new "fine proportional part" = K5 times the new fine phase angle $\phi$ times the "fine gain";

"sweep" = K6 times the "lead" times "fine gain";

"lead" = ±1 where the sign is inverted each time a crossing of zero phase is detected; and "fine gain" = a number FINE GAIN that is initially set to a number MAX GAIN and then reduced gradually to a number MIN GAIN according to a rule. The rule for adjusting FINE GAIN is as follows:

If there have been two successive crossings of zero phase in the previous two calculation time frames, then FINE GAIN is reduced by 2·Δ GAIN where ΔGAIN may be unity. On the other hand if no zero crossing has occurred for two calculation time frames, then FINE GAIN is increased by ΔGAIN.

"Fine gain" is also used to detect or define the condition of "fine locked" between the master and slave CCG. When fine gain reduces to a certain threshold value, the condition of "fine locked" is declared, causing a state change from CS21 to CS22. After this condition is achieved, the condition of "fine unlocked" is declared if the fine gain increases to a second threshold value, which is higher than the first threshold value (thus providing hysteresis).

The DAC setting DS is then rounded to the most significant 16 bits.

Figure 15:
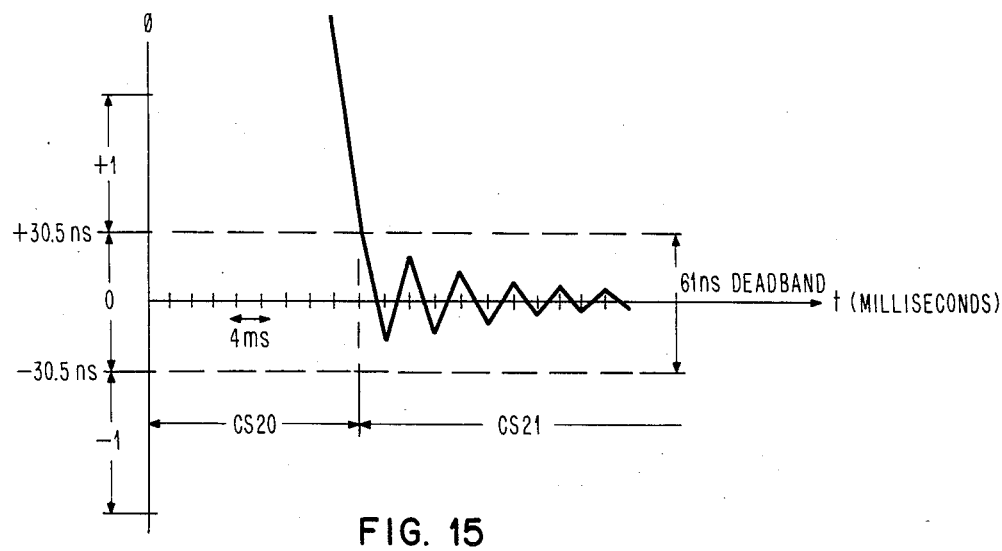
FIG. 15 is an extension of FIG. 12 with a much larger vertical scale.
Figure 16:
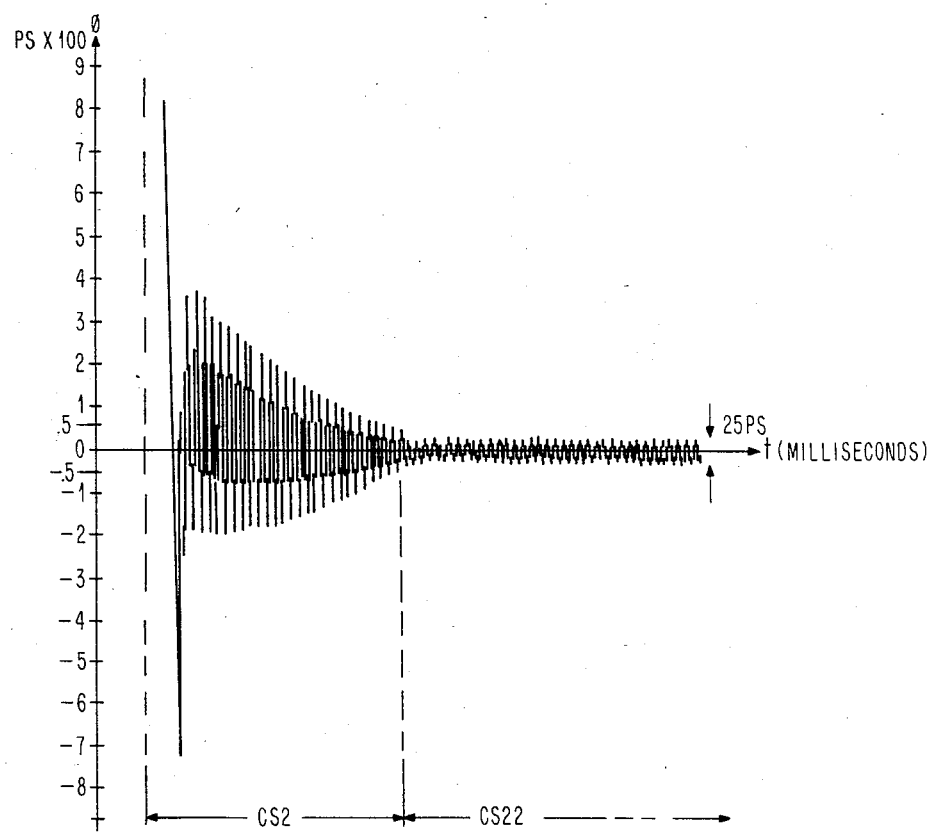
FIG. 16 is an extension of FIG. 15 with a much smaller horizontal scale.

FIG. 15 illustrates the excursions made by the phase difference after it enters the 61 ns wide deadband. FIG. 16 is a diagram similar to FIG. 15 with the phase time scale expanded and the real time scale compressed. As shown in the left-hand portion of FIG. 16, in the region in which the slave unit is under the control of the routine CS 21 the peak to peak excursions across the zero phase line reduce in amplitude until (due to the reduction of "fine gain") they reach some arbitrary value, approximately 100 ps in this case, in which the master and slave units are considered to be in phase and thus "fine locked".

The routine CS 21 is utilized until the crosslocked state is acquired. During each sweep across the zero phase line, the value "lead" is switched from +1 to −1 or from −1 to +1. As may be noted from the formula (6), above, the integration term is 0 whenever the I flag equals 0. After the first zero crossing, the I flag becomes 1 and "turns on" the integrator.

The entire fine phase locking procedure, starting from the beginning of operation of the routine CS 19 and terminating when lock is declared, should not exceed a prescribed maximum time, such as two minutes. The routine CS 21 monitors this elapsed time with the 8253 timer 38 and the program interrupt routine TIME-OUT. If this time is exceeded, CS 21 restarts the entire locking procedure by returning control to the routine CS 16.

After fine lock is declared, control is passed to the routine CS 22. CS 22 executes the same control functions as are carried out by CS 21; however, CS 22 no longer looks for TIMEOUT. CS 22 effects the modulation scanning at a low sweep amplitude, in the order of 25 ps peak-to-peak, as indicated in FIG. 16. This amplitude is slightly less than the jitter caused by phase noise, which is in the order of 30 ps peak-to-peak. The modulation scanning thus assures repeated zero crossings of the phase time difference without adding significantly to the system noise.

At the time that the fine crosslock state is reached, and control is given to the routine CS 22, the slave CCG can be placed "on line" to a system which requires clock signals. When this occurs, the master unit calls a routine CS 49 which sets an aging correction flag. This flag permits the master CCG to compute subsequent readjustments in the DAC setting, every 24 hours, to compensate for aging. When these readjustments are made, the master increments the DAC count by 1 unit every 8 ms causing the master clock frequency to ramp to a new setting. During this readjustment process, the slave CCG remains crosslocked to the master and closely tracks this frequency change.

If, at some subsequent time, the phase difference between the slave and master clocks exceeds 120 ps (equivalent to about 50 DAC steps) the state of crosslock is "undeclared" and the slave unit returns to the beginning of the locking procedure, illustrated in FIG. 12, and attempts again to achieve lock.

As noted above, both the master and slave CCG incorporate firmware to compensate for aging. Both the TVCXO 58 and the ovenized VCXO 60 are subject to aging of as much as $10^{-8}$ and $10^{-10}$ per day, respectively. The direction of aging is not predictable. This means that between two partner CCG modules, the different aging rate may be as much as $2 \times 10^8$ per day or $7.3 \times 10^{-6}$ per year. At such a rate the entire control range for one CCG tracking the other will be used up in 5½ years. To extend this time, a provision is made in the firmware to have the master CCG help the slave (tracking) CCG by gradually moving toward the edge of its control range to correct this aging effect. This provision gives at least 11 years of aging life and, since the aging rate reduces over time, it should give closer to 15 years of aging life.

Figure 17:
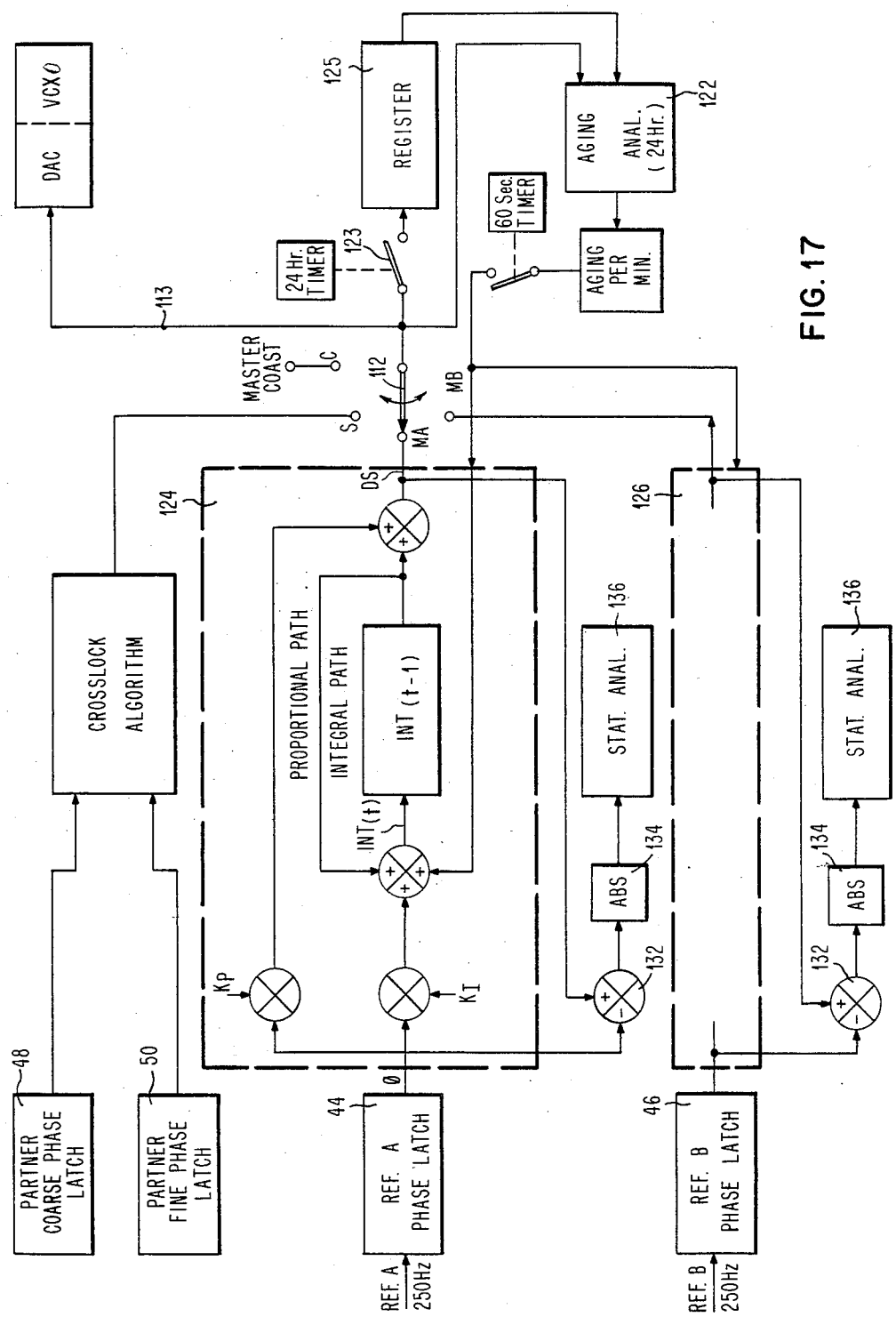
FIG. 17 is a block diagram showing the control and operation algorithm for the clock system of FIG. 1.

FIG. 17 illustrates the control function for synchronizing the master CCG to one of two external reference clocks in an RCI/CCG module as shown in FIG. 3. At the left-hand side of FIG. 17 are shown the partner coarse and fine phase latches 48 and 50, respectively, and the REF A and REF B phase latches 44 and 46. The numbers stored in these latches at the end of every 4 ms interval are processed by the microprocessor 30 in the manner illustrated in FIG. 17. At the center of the Figure is a symbolically indicated data path switch 112: a software switch which is "set" by the microprocessor in one of four positions. If set in a first position S, the CCG operates as a slave unit. If set in one of the other three positions C, MA or MB, the CCG operates as a master which either "coasts" with the frequency at which it is operating (position C) or follows (tracks) the reference clock signals REF A and REF B (positions MA and MB), respectively.

The aging analysis referred to above is performed by a firmware routine 122. A software switch 123 applies the DAC control value on line 113 to a register 124 once every 24 hours. Just prior to the switching time the value stored in the register 125 is compared to the current DAC control value by the routine 122. This routine determines the amount and direction of aging at the end of this 24 hour period. Once every 60 seconds a value determined by this aging analysis is summed into the integrators that control the VCXO.

Although the external clock signals REF A and REF B may be received from a local time standard such as a cesium nuclear clock or rubidium vapor time standard, or from a national time standard network, these signals are subject to both phase noise (jitter) and frequency noise (wander). The firmware illustrated in FIG. 17 operates to "loosely couple" the master CCG to one of these external reference signals. This firmware, delineated by the dashed lines 124 and 126, is identical for each reference signal. The firmware implements a classical proportional plus integral control algorithm according to the formulae:

$$DS_{(t)} = K_p \phi(t) + INT(t) \quad (b\ 7)$$

$$INT_{(t)} = K_I \phi(t) + INT(t-1) \quad (8)$$

The proportionality constants $K_p$ and $K_I$ in these formulae may be dynamically adjusted to provide adaptive bandwidth control. For the initial acquisition of lock to the external reference signal it is desirable to provide a broad bandwidth so as to allow a large pull in frequency range. Once lock has been achieved a very narrow bandwidth is preferable because jitter and wander may thus be lightly attenuated. With such attenuation it is possible to make phase drift measurements and thereby detect the loss of or disturbance to the external reference signals.

Jitter or phase variation is measured by subtracting the original signal from the filtered signal in a comparator 132, taking the absolute value 134, and performing a statistical analysis 136 to detect the presence of a faulty signal before it can effect the frequency of the output clock signal generated by the CCG. This statistical analysis repeatedly updates peak jitter with a new peak if the new peak exceeds the old. If the updated peak during the previous one second interval exceeds a prescribed threshold, the external reference clock signal is considered faulty.

Frequency variations (wander) in the external reference clock signals will normally be cyclic with a period of 24 hours. The peak frequency excursions of this wander are smoothed by integration; however, wander cannot be eliminated entirely.

Figure 18:
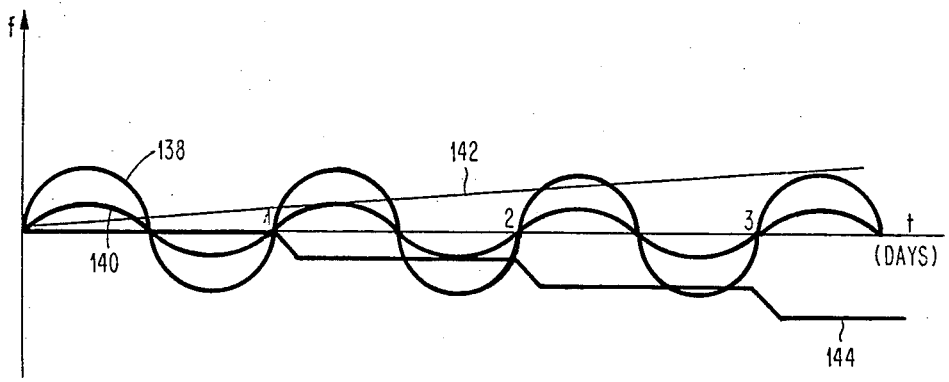
FIG. 18 is a frequency versus time diagram illustrating the aging correction employed in the algorithm illustrated in FIG. 17.

FIG. 18 illustrates both the frequency wander of the external reference clock and the manner in which the equipment aging is compensated. The frequency of the reference signal, for example REF A, is indicated at 138 over a period of three days. The integrated reference signal frequency, to which the master CCG is locked, is indicated by the line 140. Equipment aging would result in a change of frequency in a positive direction along the line 142 if the master were allowed to coast. This aging may be compensated every 24 hours by ramping the DAC of the master CCG in the opposite direction as indicated by the line 144. Actually, in practice as has been explained above, the total compensation for a 24 hour period is divided by 1440 (60 minutes per hour times 24 hours) and the resulting compensation (aging correction per minute) is summed into the DAC control integrators every 60 seconds.

The description of the apparatus according to the present invention for producing a clock pulse signal is now complete. It will be understood from this description that the two CCG's, which operate in master/slave relationship, produce clock pulse signal outputs which are identical in frequency and whose edge relationships remain within a small tolerance band. Although there can be a D.C. (static) offset between the leading edges of the two clock pulse signals (which can be compensated of course), the dynamic phase tolerance between these leading edges does not exceed the sum of the ambient, Gaussian phase noise of the individual voltage controlled crystal oscillators (VCXO's). Typically this maximum dynamic phase tolerance is 12.5 picoseconds.

There has thus been shown and described a novel digital clock apparatus which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All changes, modifications, variations and other uses and applications which do not depart from the spirit and scope of the invention are deemed to be covered by the invention which is limited only by the claims which follow.

What is claimed is:

1. Apparatus for generating a stable clock pulse signal, said apparatus comprising in combination:
   (a) a first clock generator including:
      (1) a first output terminal adapted to present a first clock pulse signal;
      (2) first controllable oscillator means connected to said first output terminal for producing said first clock pulse signal, said first oscillator means having a first control input and being responsive to a first control signal applied to said first control input to vary the frequency of said first clock pulse signal; and
      (3) first control means connected to said first control input for producing said first control signal to maintain the frequency of said first clock pulse signal substantially constant; and
   (b) a second clock generator including:
      (1) a second output terminal adapted to present a second clock pulse signal;
      (2) a second input terminal connected to said first output terminal of said first clock generator and adapted to receive said first clock pulse signal from said first clock generator;
      (3) second controllable oscillator means connected to said second output terminal for producing said second clock pulse signal, said second oscillator means having a second control input and being responsive to a second control signal applied to said second control input to vary the frequency of said second clock pulse signal; and
      (4) second control means connected to said second input terminal and to said second control input for producing said second control signal in response to said first clock pulse signal, said second control signal causing the frequency and phase of said second clock pulse signal to closely follow the frequency and phase of said first clock pulse signal,
      the first and second control means each comprising a fine phase lead-lag counter and a fine phase latch connected to an output of the counter, the counter being enabled by an output of an emitter coupled logic gate, the emitter coupled logic gate output indicating a leading or lagging phase condition between the first and second clock pulse signal outputs of the first and second clock generators;
   (c) an external reference clock generator means for providing at least one reference clock signal through a reference clock interface to the first and second clock generators, one of the first clock generator or the second clock generator providing the stable clock pulse signal; and (d) a processing means, connected to the first and second control means, for processing data in accordance with a particular algorithm.

2. The apparatus defined in claim 1, wherein the frequency of said second clock pulse signal is identical to that of the first clock pulse signal, and wherein the dynamic phase tolerance between said second clock pulse signal and said first clock pulse signal, excluding a compensatable D.C. offset, does not exceed the sum of the ambient phase noise of said first and second oscillator means.

3. The apparatus defined in claim 2, wherein said dynamic phase tolerance does not substantially exceed 12.5 picoseconds.

4. The apparatus defined in claim 1, wherein said first clock generator includes a first input terminal connected to said second output terminal of said second clock generator and adapted to receive said second clock pulse signal from said second clock generator, said first control means being connected to said first input terminal and being responsive to said second clock pulse signal to determine whether said second clock pulse signal closely follows the frequency and phase of said first clock pulse signal.

5. The apparatus defined in claim 4, wherein said first control means produces a first status signal indicating when the second clock pulse signal fails to closely follow said first clock pulse signal in phase.

6. The apparatus defined in claim 4, wherein said first control means produces said first control signal in response to said second clock pulse signal such that said first control signal causes the frequency and phase of said first clock pulse signal to closely follow the frequency and phase of said second clock pulse signal, whereby said first control means and said second control means operate, alternatively, in either a master mode or a slave mode such that the clock pulse signal produced by one of said first and said second clock generators closely follows, in frequency and phase, the clock pulse signal produced by the other one of said first and said second clock generators.

7. The apparatus defined in claim 6, wherein said first clock generator is identical in structure and operation to said second clock generator.

8. The apparatus defined in claim 1, wherein said first controllable oscillator means is a first voltage controlled crystal oscillator arranged in a first oven for providing a stabilized elevated temperature.

9. The apparatus defined in claim 1, wherein said second controllable oscillator means is a second voltage controlled crystal oscillator arranged in a second oven for providing a stabilized elevated temperature.

10. The apparatus defined in claim 1, wherein said first control means includes (i) first digital phase comparator means, connected to said first output terminal, for comparing the phase of said first clock pulse signal with the phase of a reference clock signal and producing a first digital signal representative of the difference in phase, and (ii) the processing means comprising a first digital microprocessor, connected to said first phase comparator means, for producing said first control signal in response to said first digital signal.

11. The apparatus defined in claim 10, wherein said first controllable oscillator means includes (i) a first digital-to-analog converter, connected to said first microprocessor, and (ii) a first voltage controlled oscillator, connected to said first digital-to-analog converter, whereby said microprocessor produces said first control signal in digital form and said digital-to-analog converter converts this signal into an analog voltage for controlling said first oscillator.

12. The apparatus defined in claim 10, wherein said first controllable oscillator means includes (i) a first controllable high frequency oscillator for producing a first high frequency signal of controllable high frequency, and (ii) a first high frequency divider, responsive to said first high frequency signal, for producing at least two different first lower frequency signals being equal to a respective fraction of said high frequency.

13. The apparatus defined in claim 12, wherein the high frequency is 16,384 MHz and said respective lower frequencies are 8.192 MHz and 250 Hz.

14. The apparatus defined in claim 1, wherein said second control means includes (i) second digital phase comparator means, connected to said second output termimal, for comparing the phase of said second clock pulse signal with the phase of a reference clock signal and producing a second digital signal representative of the difference in phase, and (ii) the processing means comprising a second digital microprocessor, connected to said second phase comparator means, for producing said second control signal in response to said second digital signal.

15. The apparatus defined in claim 14, wherein said second controllable oscillator means includes (i) a second digital-to-analog converter, connected to said second microprocessor, and (ii) a second voltage controlled oscillator, connected to said second digital-to-analog converter, whereby said microprocessor produces said second control signal in digital form and said digital-to-analog converter converts this signal into an analog voltage for controlling said second oscillator.

16. The apparatus defined in claim 14, wherein said second controllable oscillator means includes (i) a second controllable high frequency oscillator for providing a second high frequency signal of controllable high frequency and (ii) a second frequency divider, responsive to said second high frequency signal, for producing at least one second lower frequency signal being equal to a respective fraction of said high frequency.

17. The apparatus defined in claim 16, wherein said high frequency is 16.384 MHz and said lower frequency is 8.192 MHz.

18. The apparatus defined in claim 17, wherein said second frequency divider means produces at least two second lower frequency signals having different, respective, lower frequencies.

19. The apparatus defined in claim 18, wherein said respective lower frequencies are 8.102 MHz and 250 Hz.

20. The apparatus defined in either one of claims 10 or 14, wherein said digital phase comparator means includes a digital, coarse phase counter, having a clock input connected to the respective output terminal of the clock generator in which it is disposed, for continuously counting the pulses in said clock pulse signal received from said respective output terminal; and a digital, coarse phase latch, connected to said coarse phase counter, for periodically receiving and storing the instantaneous, digital count in said coarse phase counter in response to pulses of said reference clock signal.

21. The apparatus defined in claim 20, wherein said microprocessor is connected to said coarse phase latch 22. The apparatus defined in claim 21, wherein at least one of said first and said second clock generator further includes a third input terminal connected to said digital coarse phase comparator and adapted to receive said reference clock signal, said reference clock signal being derived from the external reference clock generator means comprising an external, stable reference clock.

23. The apparatus defined in claim 22, wherein said at least one clock generator is said first clock generator.

24. The apparatus defined in claim 22, wherein said at least one clock generator is said second clock generator.

25. The apparatus defined in claim 23, wherein said microprocessor repeatedly and periodically checks the stability of said reference clock signal in response to said digital count received from said coarse phase latch.

26. The apparatus defined in claim 25, wherein said microprocessor freezes said first control signal if said reference clock signal is determined to be unstable.

27. The apparatus defined in claim 25, wherein said second clock generator includes a fourth input terminal connected to said second control means and adapted to receive said reference clock signal, and wherein said second control means repeatedly and periodically checks the stability of said reference clock signal.

28. The apparatus defined in claim 6, wherein said first clock generator has a third input terminal connected to said first control means and said second clock generator has a fourth input terminal connected to said second control means, said first and said second control means each being responsive to a first reference clock signal, applied to said third and said fourth input terminals, to follow the frequency and phase of said first reference clock signal when in a master mode.

29. The apparatus defined in claim 28, wherein said first and said second control means follow the time averaged frequency and time averaged phase of said first reference clock signal when in a master mode.

30. The apparatus defined in claim 28, wherein said first and said second control means repeatedly and periodically check the stability of said first reference clock signal.

31. The apparatus defined in claim 30, wherein said first and said second control means check stability by detecting variations in frequency (wander) and phase (jitter) of said first reference clock signal and comparing these variations to pre-programmed tolerances therefor.

32. The apparatus defined in claim 30, wherein the one of said first and said second control means which is in the master mode freezes its corresponding control input if said first reference clock signal is found to be unstable by both said first and said second control means.

33. The apparatus defined in any one of claims 30, 31, or 32 wherein said first and said second control means switch their master/slave relationship if said first reference clock signal is found to be unstable by the control means in the master mode but not by the control means in the slave mode.

34. The apparatus defined in any one of claims 30, 31, or 32, wherein the operation of said first and said second control means remains unchanged if said reference clock signal is found to be unstable by the control means in the slave mode but not by the control means in the master mode.

35. The apparatus defined in claim 28, wherein said first clock generator has a fifth input terminal connected to said first control means and said second clock generator has a sixth input terminal connected to said second control means, said first and said second control means being responsive to a second reference clock signal, applied to said fifth and said sixth input terminals, to compare the frequency and phase of said second reference clock signal with that of said first reference clock signal.

36. The apparatus defined in claim 35, wherein said first and said second control means repeatedly and periodically check the stability of said first and said second reference clock signals, said first and said second control means switching from following the frequency and phase of said first reference clock signal to following the frequency and phase of said second reference clock signal if said first reference clock signal is determined to be unstable.

37. The apparatus defined in claim 1, further comprising a third clock generator including:
(1) a third output terminal adapted to present a third clock pulse signal;
(2) a third input terminal connected to said first output terminal of said first clock generator and adapted to receive said first clock pulse signal from said first clock generator;
(3) third controllable oscillator means connected to said third output terminal for producing said third clock pulse signal, said third oscillator means having a third control input and being responsive to a third control signal applied to said third control input to vary the frequency of said third clock pulse signal; and
(4) third control means connected to said third input terminal and to said third control input for producing said third control signal in response to said first clock pulse signal, said third control signal causing the frequency and phase of said third clock pulse signal to closely follow the frequency and phase of said first clock pulse signal.

38. The apparatus defined in claim 37, wherein said first clock generator has a fourth input terminal connected to said first control means, said second clock generator has a fifth input terminal connected to said second control means and said third clock generator has a sixth input terminal connected to said third control means, said first, said second and said third control means being responsive to a reference clock signal applied to said fourth, said fifth and said sixth input terminals, respectively, said first control means following the frequency and phase of said reference clock signal and said first, said second and said third control means repeatedly and periodically checking the stability of said reference clock signal.

39. The apparatus defined in claim 38, wherein said first, said second and said third control means are interconnected, and wherein said first control means freezes its corresponding control input if said reference clock signal is determined to be unstable by at least two of said first, second and third control means.

40. The apparatus defined in claim 1, wherein said second clock generator includes a third input terminal connected to said second output terminal and adapted to receive said second clock pulse signal, and wherein said second control means are connected to said third input terminal.

41. The apparatus defined in claim 40, the emitter coupled logic gate having two inputs, connected respectively to said second and said third input terminals, and having an output, said gate producing a first output signal upon receipt of a signal at one of said two inputs in advance of the other, and producing no first output signal upon receipt of said other of two inputs in advance of said one.

42. The apparatus defined in claim 41, the lead lag counter for repeatedly counting the number of times said first output is produced, during a prescribed time period, and producing a second output signal representing said number.

43. The apparatus defined in claim 42, the lead lag counter having clock and enable inputs, one of said clock and enable inputs being connected to receive said first output signal and the other being connected to one of said second and said third inputs.

44. The apparatus defined in claim 43, the fine phase latch means, connected to said lead lag counter, for periodically and repeatedly storing the instantaneous value contained in said lead lag counter and producing said second output signal representing said value.

45. A system for generating a stable clock pulse signal, said system comprising in combination first and second clock generator apparatus, to which apparatus is provided a reference clock signal by an external reference clock generator, the first and second clock generator apparatus each comprising in addition to a coarse phase control loop, a fine phase control loop, comprising at least a fine phase lead-lag counting means and a fine phase latch, the fine phase control loop for providing the results of a fine phase comparison to a processing means for controlling an oscillating means shared by both the coarse and fine phase control loops, the fine phase lead-lag counting means and fine phase latch for performing the fine phase comparison of two reference clock signal outputs of the first and second clock generator apparatus, the fine phase lead-lag counting means being enabled by an output signal of an emitter coupled logic gate indicating a leading or lagging phase condition between the two reference clock signal outputs of the first and second clock generator apparatus.

* * * * *